(12) United States Patent
Yamauchi

(10) Patent No.: US 12,721,104 B2
(45) Date of Patent: Aug. 25, 2026

(54) CHIP BONDING SYSTEM AND CHIP BONDING METHOD

(71) Applicant: BONDTECH CO., LTD., Kyoto (JP)

(72) Inventor: Akira Yamauchi, Kyoto (JP)

(73) Assignee: BONDTECH CO., LTD., Kyoto (JP)

( * ) Notice: Subject to any disclaimer, the term of this patent is extended or adjusted under 35 U.S.C. 154(b) by 768 days.

(21) Appl. No.: 18/005,606

(22) PCT Filed: Jul. 29, 2021

(86) PCT No.: PCT/JP2021/028027

§ 371 (c)(1),
(2) Date: Jun. 1, 2023

(87) PCT Pub. No.: WO2022/025160

PCT Pub. Date: Feb. 3, 2022

(65) Prior Publication Data

US 2023/0307284 A1 Sep. 28, 2023

(30) Foreign Application Priority Data

Jul. 31, 2020 (JP) ................................ 2020-129988

(51) Int. Cl.
*H10P 72/70* (2026.01)
*H10P 72/00* (2026.01)
*H10P 95/00* (2026.01)

(52) U.S. Cl.
CPC ...... *H10P 72/7402* (2026.01); *H10P 72/0442* (2026.01); *H10P 95/112* (2026.01); *H10P 72/742* (2026.01)

(58) Field of Classification Search
CPC ........... H01L 21/6836; H01L 21/67132; H01L 21/7813; H01L 2221/68336;
(Continued)

(56) References Cited

U.S. PATENT DOCUMENTS 6,425,971 B1 * 7/2002 Silverbrook ........ H01L 21/6836 438/458
6,730,579 B1 * 5/2004 Sasaka .................... H01L 21/78 438/464
(Continued)

FOREIGN PATENT DOCUMENTS

JP 2007-005530 A 1/2007
JP 2009-054803 A 3/2009
(Continued)

OTHER PUBLICATIONS

JPO, JP Office Action dated Jan. 4, 2023 for Japanese Patent Application No. 2022-539548, Japan, 10 pages.
(Continued)

*Primary Examiner* — Vu A Vu
(74) *Attorney, Agent, or Firm* — ASLAN LAW, P.C.

(57) ABSTRACT

A chip bonding system (1) includes a dicing device (20) to, by dicing a dicing substrate stuck on a sheet (TE), generate a plurality of chips (CP) stuck on the sheet (TE) with chips (CP) adjacent to each other joined to each other via remaining uncut portions, an activation treatment device (60) to activate bonding surfaces of respective ones of the chips (CP) stuck to the sheet (TE), a sheet stretching device (40) to, by stretching the sheet (TE) on which the chips (CP) having bonding surfaces activated by the activation treatment device (60) are stuck, brings the chips (CP) into a state of being separated from one another, and a bonding device (30) to, by bringing one chip (CP) picked out of the chips (CP) separated from one another into contact with a substrate (WT), bond the one chip (CP) to the substrate (WT).

32 Claims, 32 Drawing Sheets

(58) Field of Classification Search
CPC . H01L 2221/68327; H01L 2224/80894; H01L 21/67144; H01L 21/78; H01L 21/67092; H01L 24/80; B23K 2101/40; B23K 26/0006; B23K 26/127; B23K 26/53
USPC .......................................................... 438/113
See application file for complete search history.

(56) References Cited

U.S. PATENT DOCUMENTS

| | | | | |
|---|---|---|---|---|
| 7,968,194 | B2 * | 6/2011 | Inada | C09J 7/35 525/437 |
| 8,821,660 | B2 * | 9/2014 | Huang | B05C 5/0245 156/247 |
| 9,159,622 | B2 * | 10/2015 | Matsuzaki | H01L 21/2686 |
| 9,269,624 | B2 * | 2/2016 | Nakamura | H01L 21/67092 |
| 10,269,641 | B2 * | 4/2019 | Chiang | H01L 21/78 |
| 10,615,057 | B1 * | 4/2020 | Chorosinski | H01L 23/544 |
| 10,927,487 | B2 * | 2/2021 | Bockos | D06F 34/28 |
| 10,991,621 | B2 * | 4/2021 | Esteron | H01L 24/49 |
| 11,600,515 | B2 * | 3/2023 | Jeong | H01L 21/6732 |
| 2001/0023995 | A1 | 9/2001 | Nguyen et al. | |
| 2005/0158913 | A1 * | 7/2005 | Kouda | H10F 39/026 438/113 |
| 2009/0061596 | A1 | 3/2009 | Takahashi et al. | |
| 2014/0178680 | A1 * | 6/2014 | Takamoto | H10P 72/7402 428/704 |
| 2014/0205816 | A1 * | 7/2014 | Maejima | C08L 61/06 428/354 |
| 2018/0096892 | A1 | 4/2018 | Sandoh | |
| 2018/0308819 | A1 | 10/2018 | Uzoh | |
| 2021/0265300 | A1 | 8/2021 | Yamauchi et al. | |

FOREIGN PATENT DOCUMENTS

| | | | |
|---|---|---|---|
| JP | 2013-251404 | A | 12/2013 |
| JP | 2018-056502 | A | 4/2018 |
| JP | 2018-160687 | A | 10/2018 |
| JP | 2020-068322 | A | 4/2020 |
| JP | 2020-518133 | A | 6/2020 |
| TW | 460988 | B | 10/2001 |
| WO | WO 2019/008809 | A1 | 1/2019 |
| WO | WO 2020/044579 | A1 | 3/2020 |

OTHER PUBLICATIONS

TW Office Action, issued for the corresponding TW patent application No. 110128091, Oct. 24, 2024, Taiwan, 14 pages.

* cited by examiner 10
30
31
315
320
39
393
394
391
392
AX
114a
114
RI3
119
11
RI2
CP
AR44
113
111
111a
CP-f
TE
AR43
Pos1
432a
432b
33
CPf
WTf
CP
33H
AR41
AR42
36
WT
CONTROLLER
90
X
Y
Z 3067
3672
3673
3674
3671
3675
3676
3677
RI1
651
652
64
CP
AR32
TE
PLM2
3612
3611
3613
3061
3612a
3064a
3634
3631
3633
3063
3632
614
AR31
AR33
3623
622
621
3060
X
Z
Y 4010
114
4119
RI1
4011
114a
4118
AR24
113
39
393
394
391
392
CPf
CP
111a
111
TE
AX
31
315
320
AR23
Pos1
432a
432b
33
CPf
WTf
CP
33H
AR21
AR22
36
30
WT
X
Z
Y

CHIP BONDING SYSTEM AND CHIP BONDING METHOD

CROSS-REFERENCE TO RELATED APPLICATIONS

This application claims priority to JP Patent Application No. 2020-129988 filed on Jul. 31, 2020, and this application claims priority to and is a 371 of international PCT Application No. PCT/JP2021/028027 filed on Jul. 29, 2021, the entire contents of which are hereby incorporated by reference.

TECHNICAL FIELD

The present disclosure relates to a chip bonding system and a chip bonding method.

BACKGROUND ART

A bonding method for a semiconductor chip of arranging, with the back surface of the semiconductor chip stuck to a sheet, the semiconductor chip and a substrate in such a manner as to cause the activated front surface of the semiconductor chip and the activated front surface of the substrate to face each other and, by pressing the back surface of the semiconductor chip via the sheet and bringing the activated front surface of the semiconductor chip into close contact with the activated front surface of the substrate, bonding the semiconductor chip to the substrate is proposed (see, for example, Patent Literature 1).

CITATION LIST

Patent Literature

Patent Literature 1: Unexamined Japanese Patent Application Publication No. 2018-160687

SUMMARY OF INVENTION

Technical Problem

However, as described in Patent Literature 1, when the front surface of the semiconductor chip is activated with the back surface of the semiconductor chip stuck to the sheet, impurities generated by etching the sheet sometimes adhere to the front surface of the semiconductor chip. In this case, bonding strength between the semiconductor chip and the substrate deteriorates and there is a possibility that a bonding defect between the chip and the substrate occurs.

The present disclosure has been made in consideration of the above-described conditions, and an objective of the present disclosure is to provide a chip bonding system and a chip bonding method that are capable of preventing a bonding defect between a chip and a substrate from occurring.

Solution to Problem

In order to achieve the above-described objective, a chip bonding system according to the present disclosure is a chip bonding system for bonding a chip to a substrate and includes:

a dicing device to, by dicing a dicing substrate stuck on a sheet, generate a plurality of chips that is stuck on the sheet with chips adjacent to each other in contact with each other or joined to each other at portions in a direction orthogonal to a thickness direction of the dicing substrate;

an activation treatment device to activate bonding surfaces of respective ones of the plurality of chips that is stuck on the sheet with chips adjacent to each other in contact with each other or joined to each other at portions; and a chip bonding device to, after the bonding surfaces are activated by the activation treatment device, by bringing one chip picked out of the plurality of chips, the plurality of chips being stuck on the sheet while being separated from one another, into contact with the substrate, bond the one chip to the substrate.

A chip bonding method according to another aspect of the present disclosure is a chip bonding method for bonding a chip to a substrate and includes:

a dicing step of, by dicing a dicing substrate stuck on a sheet, generating a plurality of chips that is arranged with chips adjacent to each other in contact with each other in a direction orthogonal to a thickness direction of the dicing substrate;

an activation step of activating bonding surfaces of respective ones of the plurality of chips that is stuck on the sheet while being in contact with each other or joined to each other at portions;

a stretching step of, by stretching the sheet on which the plurality of chips, the plurality of chips having the bonding surfaces activated in the activation step, is stuck, bringing the plurality of chips into a state of being separated from one another; and a bonding step of, by bringing one chip picked out of the plurality of chips into contact with the substrate, bonding the one chip to the substrate.

Advantageous Effects of Invention

According to the present disclosure, the dicing device, by dicing a dicing substrate stuck on a sheet, generates a plurality of chips that is stuck on the sheet with chips adjacent to each other in contact with each other or joined to each other at portions in a direction orthogonal to the thickness direction of the dicing substrate. The activation treatment device activates bonding surfaces of respective ones of the plurality of chips that is stuck on the sheet while being in contact with each other or joined to each other at portions. Since this configuration enables activation treatment activating the bonding surfaces of the respective ones of the plurality of chips to be performed with the sheet not exposed from interspaces between the respective ones of the plurality of chips, it is possible to prevent impurities originating from the sheet from adhering to the bonding surfaces of the respective ones of the plurality of chips. Therefore, occurrence of a bonding defect between a chip and a substrate caused by impurities having adhered to the bonding surface of the chip can be prevented.

DESCRIPTION OF EMBODIMENTS

Figure 1:
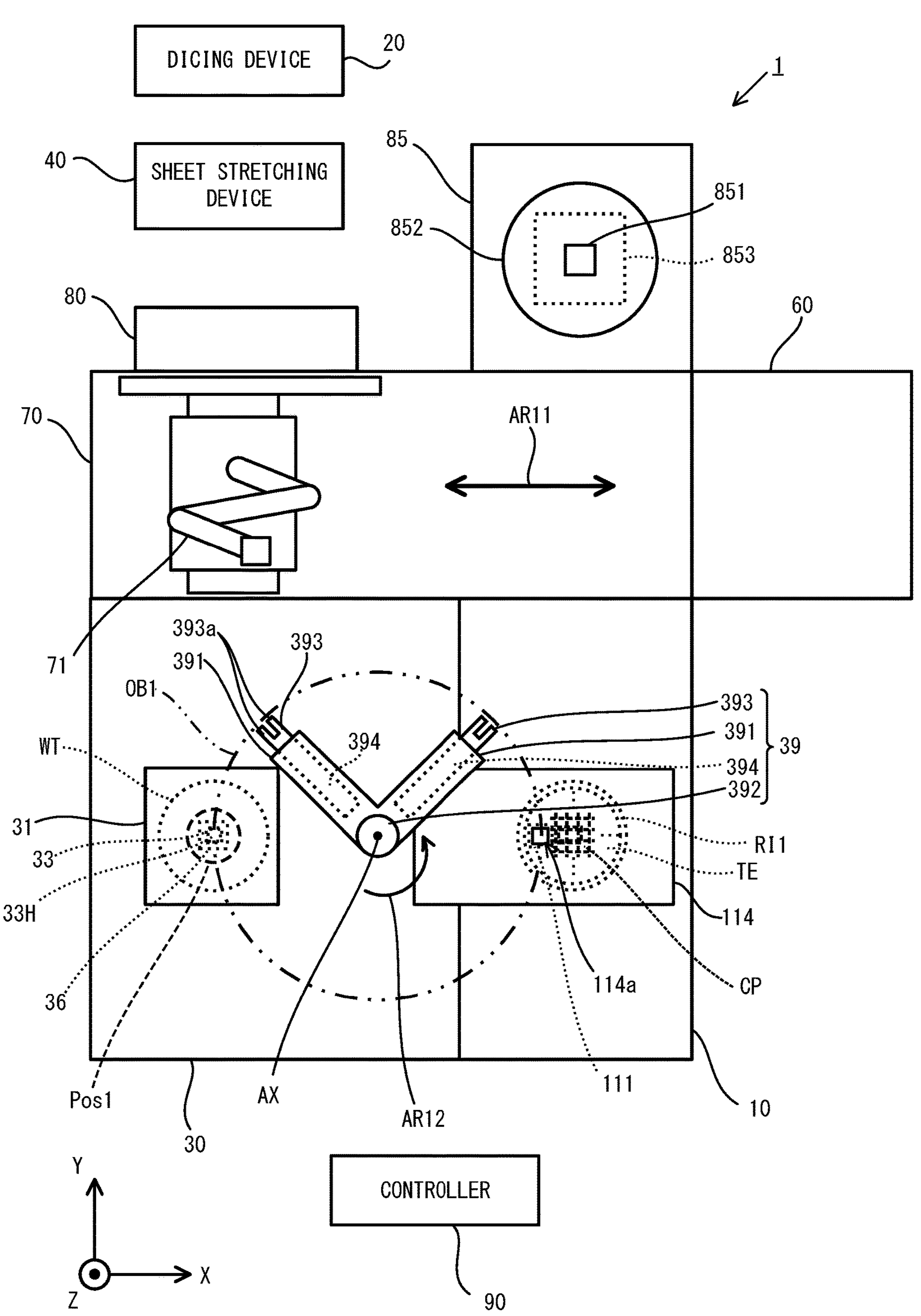
FIG. 1 is a schematic configuration diagram of a chip bonding system according to an embodiment of the present disclosure.

A chip bonding system according to an embodiment of the present disclosure is described below, referring to the drawings. The chip bonding system according to the present embodiment is a system for mounting a chip on a substrate. Examples of the chip include a semiconductor chip supplied from a diced substrate. The chip bonding system bonds a chip on the substrate by, after subjecting a mounting surface of the substrate on which the chip is mounted and a bonding surface of the chip to activation treatment, bringing the chip into contact with the substrate or applying pressure to the chip. By subsequently or simultaneously applying heat, the chip bonding system firmly bonds the chip to the substrate.

As illustrated in FIG. 1, a chip bonding system 1 according to the present embodiment includes a chip feeding device 10, a chip transportation device 39, a bonding device 30, an activation treatment device 60, a transportation device 70, a carrying in/out unit 80, a cleaning device 85, and a controller 90. The chip bonding system 1 also includes a dicing device 20 and a sheet stretching device 40. The transportation device 70 includes a transportation robot 71 that has an arm to grasp a substrate WT or ring-shaped frames RI1, RI2, and RI3 holding a sheet TE on which chips CP are stuck. In this configuration, the sheet TE is, for example, formed of a resin. The transportation robot 71 is capable of moving to positions at each of which the transportation robot 71 transfers a substrate WT or the ring-shaped frames RI1, RI2, and RI3 holding a sheet TE on which chips CP are stuck that the transportation robot 71 received from the carrying in/out unit 80 to the activation treatment device 60, the cleaning device 85, the bonding device 30, or the chip feeding device 10, as illustrated by an arrow AR11 in FIG. 1.

When the transportation robot 71 receives a substrate WT from the carrying in/out unit 80, the transportation robot 71, while grasping the received substrate WT, moves to a position at which the transportation robot 71 transfers the substrate WT to the activation treatment device 60 and transfers the substrate WT to the activation treatment device 60. In addition, after, in the activation treatment device 60, activation treatment of a mounting surface WTf of the substrate WT is finished, the transportation robot 71 receives the substrate WT from the activation treatment device 60 and transfers the received substrate WT to the cleaning device 85. Further, after, in the cleaning device 85, aqueous cleaning of the substrate WT is finished, the transportation robot 71 receives the substrate WT from the cleaning device 85 and, while grasping the received substrate WT, turns over the substrate WT and subsequently moves to a position at which the transportation robot 71 transfers the substrate WT to the bonding device 30. At the transfer position, the transportation robot 71 transfers the substrate WT to the bonding device 30.

In addition, when the transportation robot 71 receives the ring-shaped frame RI1 holding a sheet TE on which a dicing substrate WD after dicing is stuck from the carrying in/out unit 80, the transportation robot 71, while grasping the received ring-shaped frame RI1, moves to a position at which the transportation robot 71 transfers the ring-shaped frame RI1 to the activation treatment device 60 and transfers the ring-shaped frame RI1 to the activation treatment device 60. Further, after, in the activation treatment device 60, activation treatment of bonding surfaces of chips CP stuck on the sheet TE is finished, the transportation robot 71 receives the ring-shaped frame RI1 from the activation treatment device 60 and transfers the received ring-shaped frame RI1 to the carrying in/out unit 80. Subsequently, when the transportation robot 71 receives the ring-shaped frames RI2 and RI3 holding a sheet TE on which a plurality of chips CP that is separated from one another is stuck from the carrying in/out unit 80, the transportation robot 71, while grasping the received ring-shaped frames RI2 and RI3, moves to a position at which the transportation robot 71 transfers the ring-shaped frame RI2 to the chip feeding device 10 and transfers the ring-shaped frame RI2 to the chip feeding device 10. In addition, in the transportation device 70, for example, a high efficiency particulate air (HEPA) filter (not illustrated) is installed. Because of this configuration, the inside of the transportation device 70 is maintained at an atmospheric pressure environment that contains an extremely small number of particles.

Figure 2A:
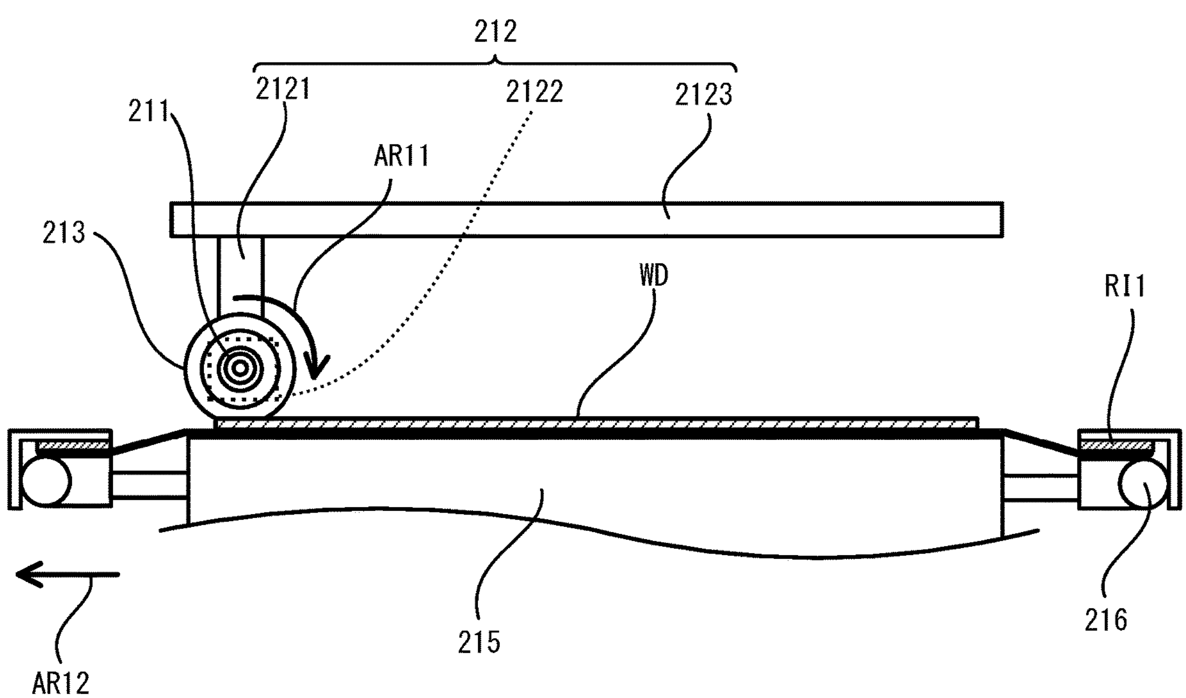
FIG. 2A is an operation explanatory diagram of a dicing device according to the embodiment.
Figure 2B:
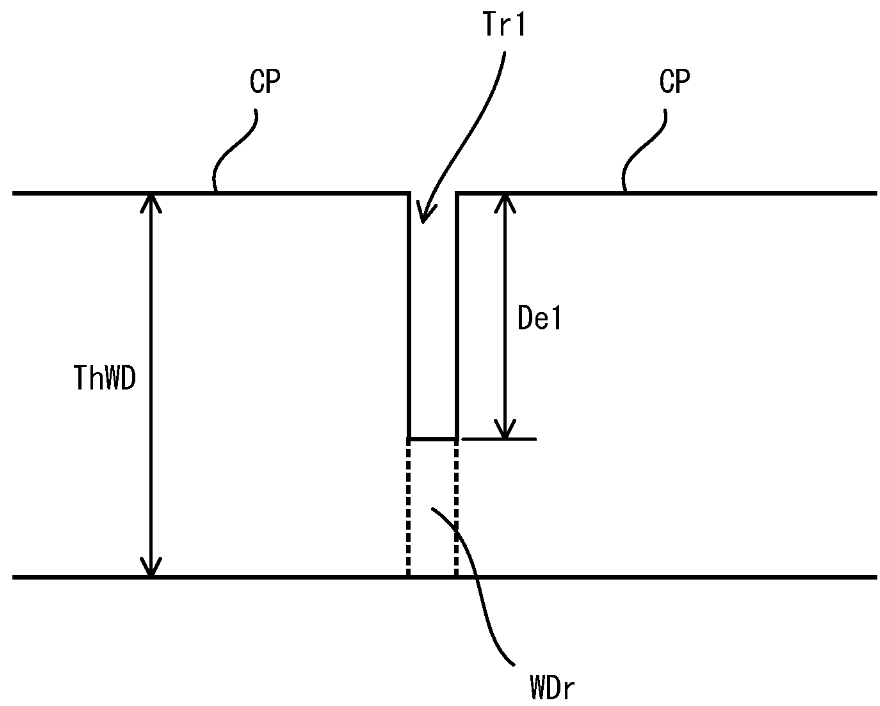
FIG. 2B is a cross-sectional view of a dicing substrate after a dicing step according to the embodiment.

The dicing device 20, by dicing a dicing substrate WD stuck on a sheet TE, generates a plurality of chips CP that is stuck on the sheet TE with chips adjacent to each other joined to each other at portions thereof in directions orthogonal to the thickness direction of the dicing substrate WD. The dicing device 20 includes a sucker (not illustrated) and also includes a holding table 215 to suck and hold a sheet TE and a chuck 216 to clamp the ring-shaped frame RI1 holding the sheet TE on the lateral side of the holding table 215, as illustrated in FIG. 2A. In this configuration, the ring-shaped frame RI1 is a first ring-shaped frame that holds a peripheral portion of a sheet TE on which a dicing substrate WD is stuck. The dicing device 20 further includes a rotary shaft 211, an annular cutting blade 213 fixed to the rotary shaft 211 and configured to cut a dicing substrate WD, and a blade driver 212 to rotation-drive the cutting blade 213 and also move the cutting blade 213 in a direction orthogonal to the thickness direction of the dicing substrate WD. In this configuration, the blade driver 212 includes a support 2121 to support the rotary shaft 211 in a rotatable manner, a motor 2122 attached to the support 2121 and configured to rotate the rotary shaft 211, and a support moving mechanism 2123 to move the support 2121 in a direction orthogonal to the thickness direction of the dicing substrate WD. The support moving mechanism 2123 includes, for example, a rail (not illustrated) from which the support 2121 is suspended, a nut (not illustrated) disposed on a portion of the support 2121, a ball screw (not illustrated) arranged along the rail and screwing into the afore-described nut, and a motor (not illustrated) to rotation-drive the ball screw. Further, the dicing device 20 includes a cleaning fluid discharger (not illustrated) to, by discharging cleaning fluid to a contact region between the cutting blade 213 and a dicing substrate WD held by the holding table 215 and surroundings thereof, cool and clean the contact region. The dicing device 20, by the motor rotation-driving the rotary shaft 211, rotates the cutting blade 213 as illustrated by an arrow AR11. In addition, the holding table 215 is configured to be rotatable about an axis along the thickness direction of the dicing substrate WD. Further, the holding table 215 is configured to be movable in a direction orthogonal to the thickness direction of the dicing substrate WD by a feed mechanism (not illustrated). The feed mechanism is a ball screw mechanism that moves the holding table 215 by, for example, rotating a ball screw using a motor. The dicing device 20 rotates the rotary shaft 211 at high speed in a direction illustrated by the arrow AR11, and the cutting blade 213 fixed to the rotary shaft 211, while rotating at high speed in association with the rotation of the rotary shaft 211, cuts the dicing substrate WD and thereby cuts circumferences of portions corresponding to chips CP on the dicing substrate WD. In this configuration, the dicing device 20 moves the cutting blade 213 that is rotating at high speed along planned division lines located at the circumferences of portions corresponding to a plurality of chips CP on the dicing substrate WD and thereby forms cut trenches. In this configuration, the dicing device 20, by moving the cutting blade 213 along a plurality of planned division lines that is arranged in one direction orthogonal to the thickness direction of the dicing substrate WD, forms the cut trenches. Subsequently, the dicing device 20, by, after rotating the dicing substrate WD 90 degrees about a central axis along the thickness direction thereof, moving the cutting blade 213 along a plurality of planned division lines that is arranged in a direction orthogonal to the afore-described one direction, forms a plurality of cut trenches. On this occasion, the dicing device 20, by setting cutting depth Del shorter than thickness ThWD of the dicing substrate WD, forms cut trenches Tr1 and remaining uncut portions WDr, as illustrated in FIG. 2B. This configuration causes a plurality of chips CP that is stuck on a sheet TE with chips adjacent to each other joined to each other via remaining uncut portions WDr in directions orthogonal to the thickness direction of the dicing substrate WD to be generated.

Figure 3:
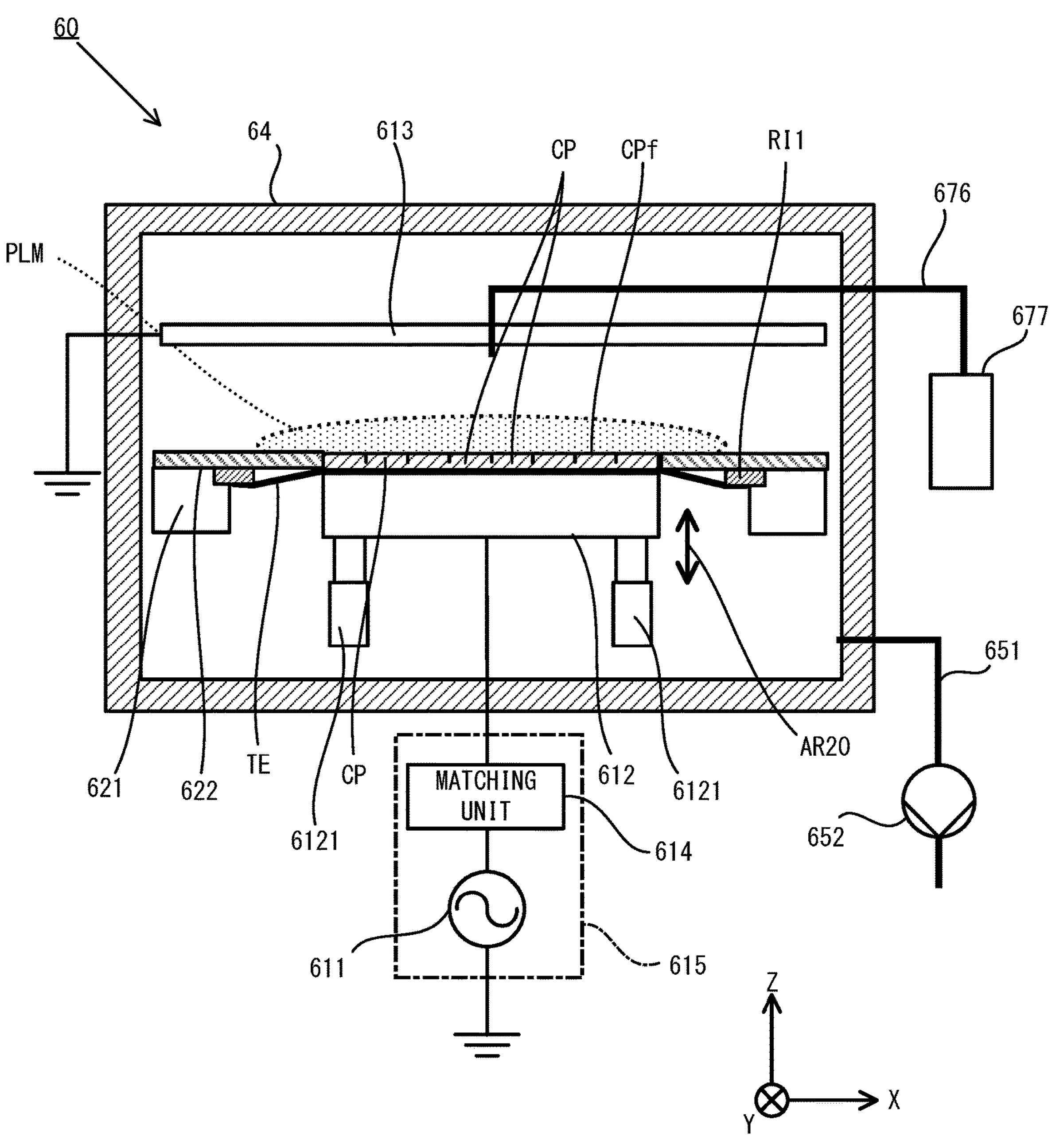
FIG. 3 is a schematic configuration diagram of an activation treatment device according to the embodiment.

The activation treatment device 60 activates bonding surfaces of respective ones of a plurality of chips CP that is stuck on a sheet TE with chips adjacent to each other joined to each other at remaining uncut portions WDr. The activation treatment device 60 includes a chamber 64, a frame holder 621 to support the ring-shaped frame RI1 holding a sheet TE, a sheet support 612 formed of a conductive material, and an electrode 613 arranged opposite to the sheet support 612, as illustrated in FIG. 3. The activation treatment device 60 also includes sheet support drivers 6121 to drive the sheet support 612 in directions illustrated by an arrow AR20, a cover 622, a high-frequency power source 611, a matching unit 614, and a gas feeder 677 to feed nitrogen gas into the chamber 64 through a feeding pipe 676. The chamber 64 is connected to a vacuum pump 652 via an exhaust pipe 651. When the vacuum pump 652 operates, gas in the chamber 64 is exhausted to the outside of the chamber 64 through the exhaust pipe 651 and gas pressure in the chamber 64 is reduced (decompressed). The high-frequency power source 611 and the matching unit 614 constitute a plasma generator 615 that generates plasma PLM between the sheet support 612 and the electrode 613 by applying a high-frequency bias between the sheet support 612 and the electrode 613. As the high-frequency power source 611, for example, a power source that generates a high-frequency voltage having a frequency of 13.56 MHz can be employed. The plasma generator 615 generating plasma PLM in vicinities of a plurality of chips CP that is stuck on the sheet TE and joined to one another via remaining uncut portions causes ions with kinetic energy to repeatedly collide with bonding surfaces CPf of the chips CP and the bonding surfaces CPf to be thereby activated.

Figure 4A:
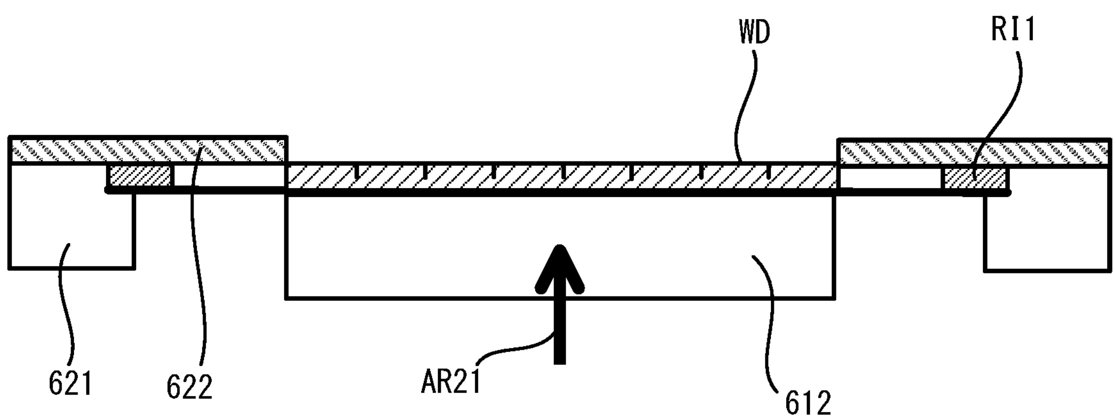
FIG. 4A is a diagram illustrating a state before activation treatment by the activation treatment device according to the embodiment.
Figure 4B:
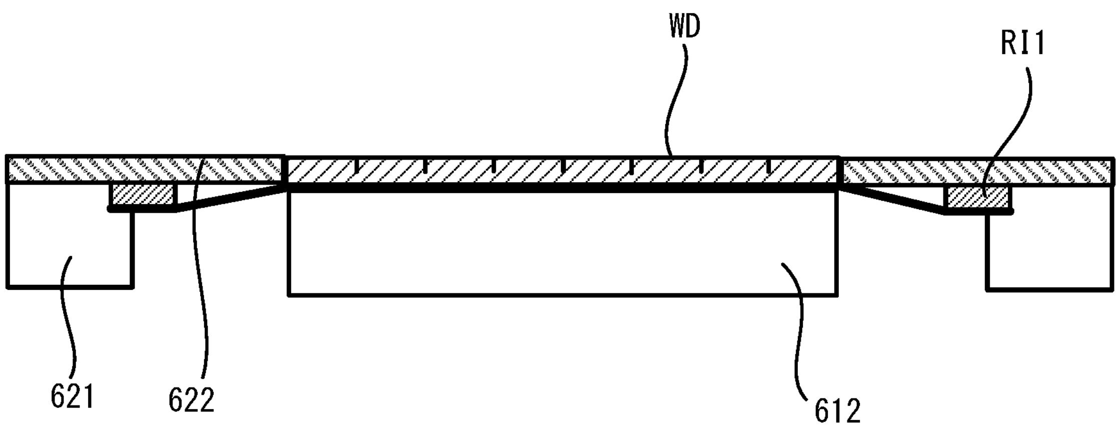
FIG. 4B is a diagram illustrating a state at the time of activation treatment by the activation treatment device according to the embodiment.

The cover 622 is formed of, for example, glass and, with the sheet TE supported by the sheet support 612, covers the sheet TE excluding a portion of the sheet TE on which a plurality of chips CP is stuck from a side of the sheet TE on which the plurality of chips CP is stuck. When a plurality of chips CP is chips produced by dicing a dicing substrate WD that is circular in plan view, the plurality of chips CP is in a state of being stuck in a region of the sheet TE that is circular in plan view. In this case, as the cover 622, a cover that has a shape covering an outer periphery region of a region of the sheet TE in which the plurality of chips CP is stuck and that is circular in plan view is employed. In this configuration, the ring-shaped frame RI1 is first arranged with a portion of the sheet TE on which a plurality of chips CP is stuck separated downward from the cover 622, as illustrated in FIG. 4A. Subsequently, the sheet support driver 6121 pushing up the sheet support 612 in such a direction as to bring the sheet support 612 close to the cover 622 as illustrated by an arrow AR21 in FIG. 4A causes the plurality of chips CP to be arranged on the inner side of the cover 622 as illustrated in FIG. 4B. This configuration enables the sheet TE excluding the portion of the sheet TE on which the plurality of chips CP is stuck to be prevented from being exposed to the plasma PLM.

Figure 5:
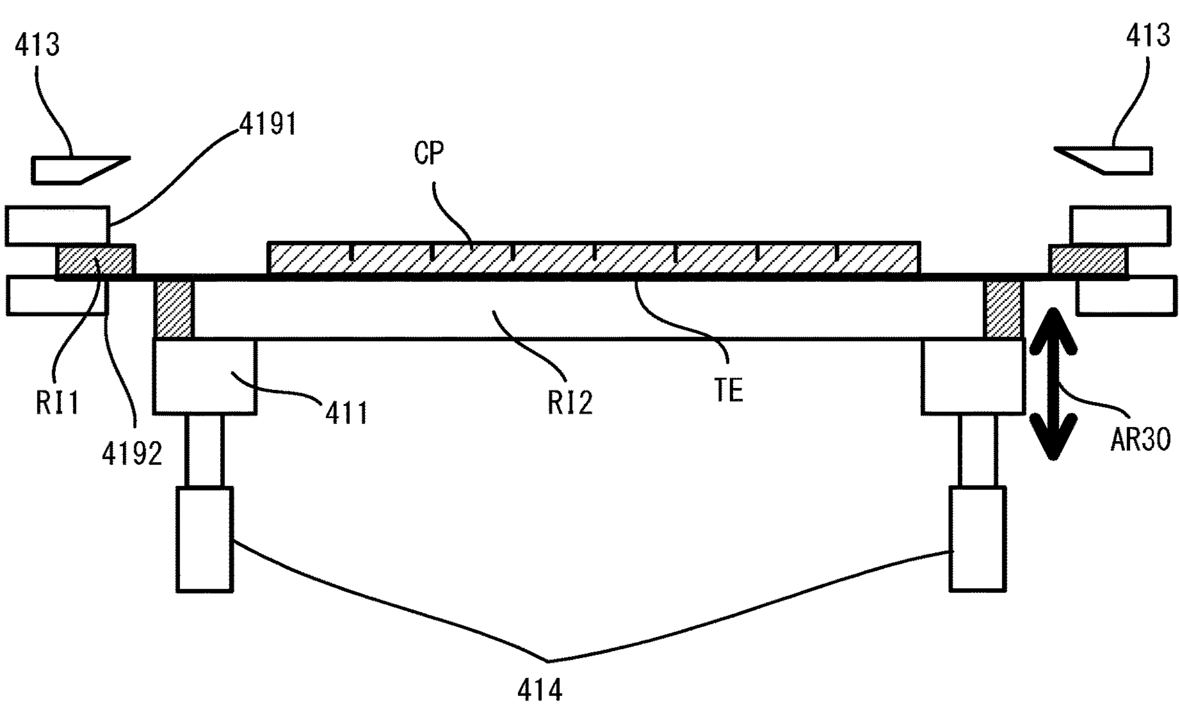
FIG. 5 is a schematic configuration diagram of a sheet stretching device according to the embodiment.

Returning to FIG. 1, the sheet stretching device 40, by utilizing a force at the time of stretching a sheet TE, breaks remaining uncut portions of a plurality of chips CP that is joined to one another via the remaining uncut portions and brings the sheet TE into a state in which the plurality of chips CP thereon is separated from one another. The sheet stretching device 40 includes frame holders 4191 and 4192 to hold the ring-shaped frame RI1 holding a sheet TE and frame supports 411, as illustrated in FIG. 5. In this configuration, the frame supports 411 are first frame supports supporting the ring-shaped frame RI2. In addition, the ring-shaped frame RI2 is a second ring-shaped frame the outside dimension of which is smaller than an inside dimension of the ring-shaped frame RI1. The sheet stretching device 40 also includes frame support drivers 414 to move the frame supports 411 in directions illustrated by an arrow AR30 and a cutting mechanism 413 to cut off a sheet TE from the ring-shaped frame RI1. The frame support drivers 414 are frame position changers that, by moving the ring-shaped frame RI2 to the opposite side to the frame support 411 side of the ring-shaped frame RI1 while making the ring-shaped frame RI2 in contact with the opposite side to the side of the sheet TE on which a plurality of chips CP is stuck, stretch the sheet TE in a radial manner from the central portion of the ring-shaped frame RI1 and brings the plurality of chips CP into a state of being separated from one another.

Figure 6A:
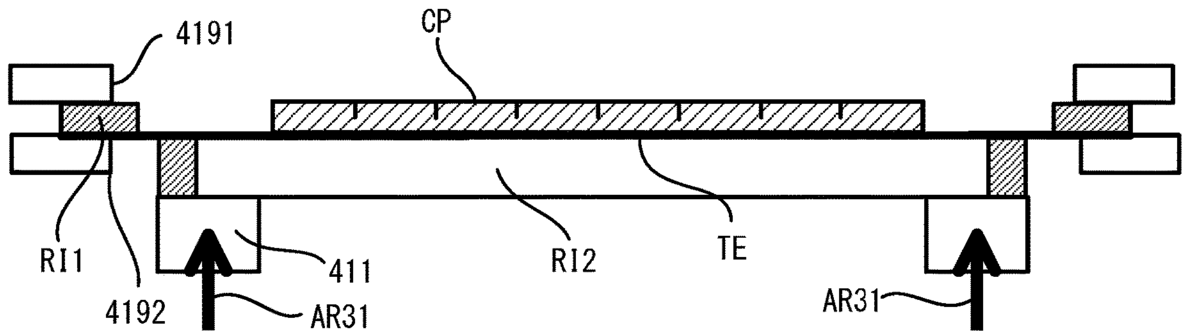
FIG. 6A is a diagram illustrating a state before the sheet stretching device according to the embodiment stretches a sheet.
Figure 6B:
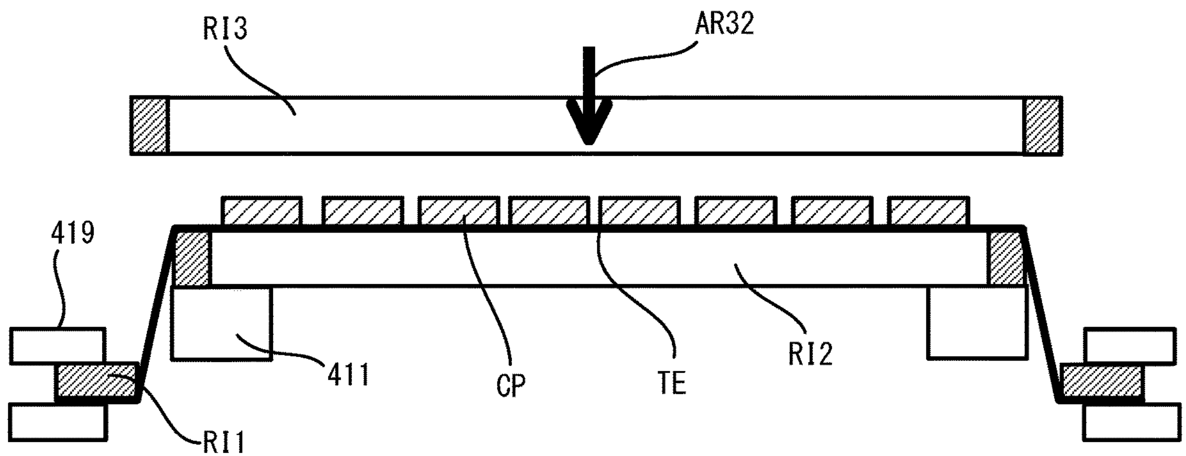
FIG. 6B is a diagram illustrating a state in which the sheet stretching device according to the embodiment has stretched the sheet.
Figure 6C:
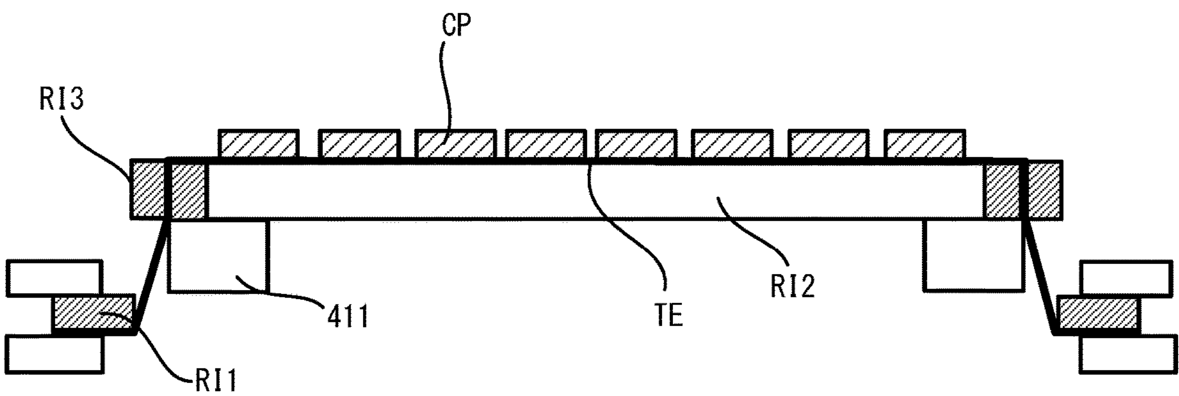
FIG. 6C is a diagram illustrating a state in which the sheet stretching device according to the embodiment has fitted a third ring-shaped frame.
Figure 6D:
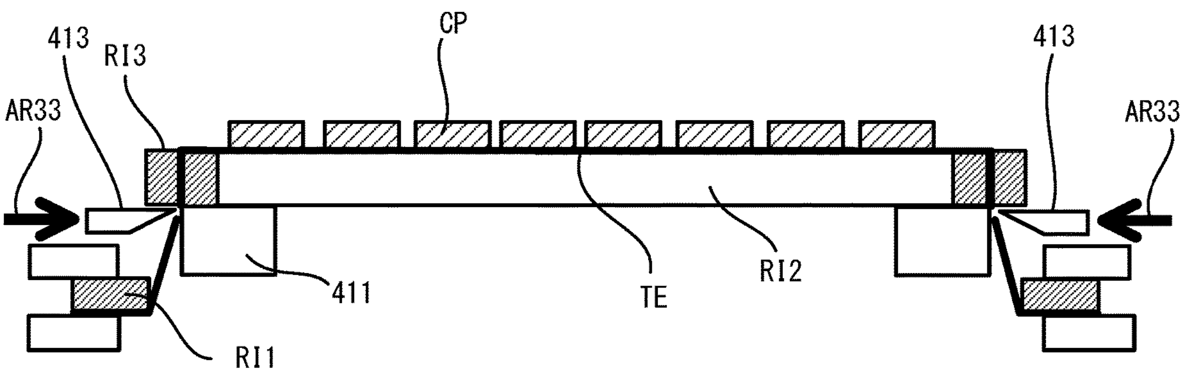
FIG. 6D is a diagram illustrating a manner in which the sheet stretching device according to the embodiment cuts off the sheet from the ring-shaped frame.

The sheet stretching device 40 first holds the ring-shaped frame RI1 by the frame holders 4191 and 4192, as illustrated in FIG. 6A. At this time, the ring-shaped frame RI2 is in contact with the opposite side to the side of the sheet TE on which the plurality of chips CP is stuck. Next, the frame support drivers 414 move the frame supports 411 supporting the ring-shaped frame RI2 vertically upward and arrange the ring-shaped frame RI2 at a position higher than the ring-shaped frame RI1 by a preset height, as illustrated by arrows AR31 in FIG. 6A. On this occasion, the sheet TE is stretched in a radial manner and external force is exerted to the remaining uncut portions joining the plurality of chips CP stuck on the sheet TE to one another, as a result of which the remaining uncut portions are cut, and, as illustrated in FIG. 6B, the plurality of chips CP is brought into a state of being separated from one another. Succeedingly, while the sheet TE is stretched, the ring-shaped frame RI3 for fixing the sheet TE to the ring-shaped frame RI2 is fitted onto the outer periphery of the ring-shaped frame RI2 from the upper side of the ring-shaped frame RI2 as illustrated by an arrow AR32 in FIG. 6B, as a result of which the sheet TE, the ring-shaped frame RI2, and the ring-shaped frame RI3 are brought into a state illustrated in FIG. 6C. In this configuration, the ring-shaped frame RI3 is a third ring-shaped frame the inside dimension of which is the same as the outside dimension of the ring-shaped frame RI2. Subsequently, as illustrated by arrows AR33 in FIG. 6D, the cutting mechanism 413 cuts off the sheet TE from the ring-shaped frame RI1. Note that the sheet stretching device 40 may be a device that does not include the cutting mechanism 413. In this case, for example, a worker is only required to cut off the sheet TE from the ring-shaped frame RI1, using a cutter. In addition, the sheet stretching device 40 is only required to be configured to move the ring-shaped frame RI2 to a position relatively higher than the ring-shaped frame RI1 and may be, for example, a device that moves the frame holders 4191 and 4192 to the −Z-direction side of the frame supports 411.

Figure 7:
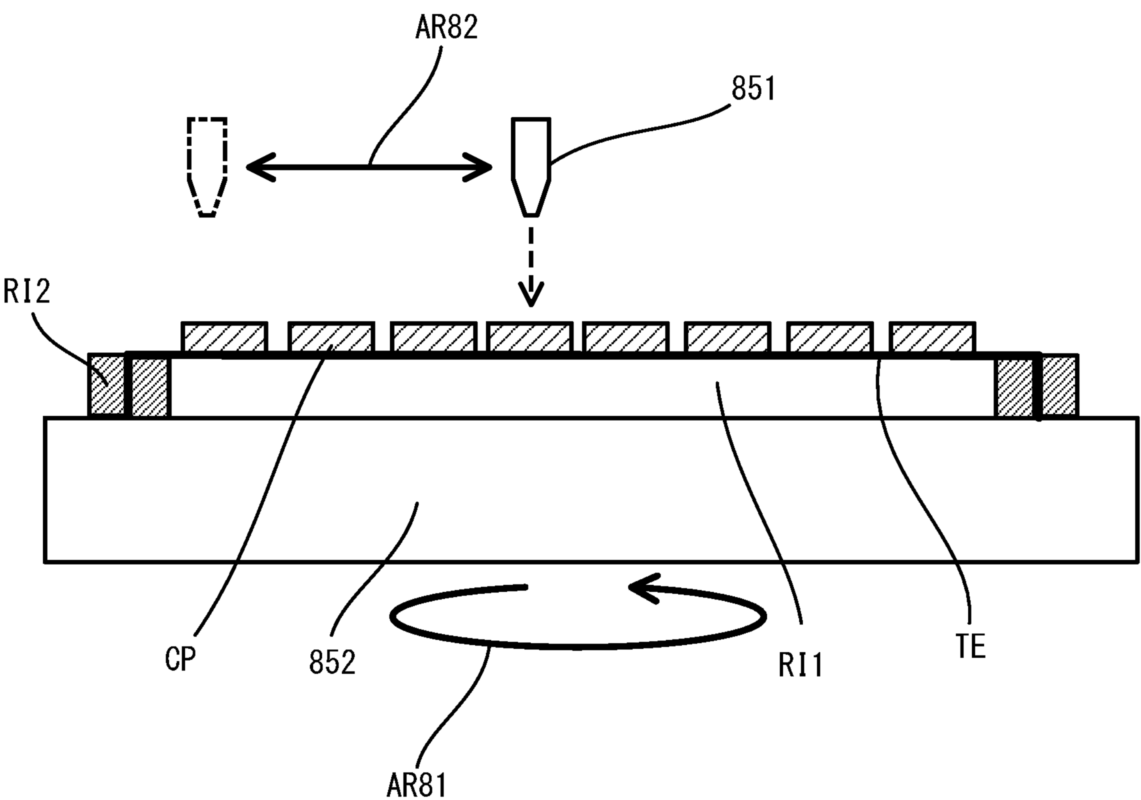
FIG. 7 is an operation explanatory diagram of a cleaning device according to the embodiment.

Returning to FIG. 1, the cleaning device 85 includes a stage 852, a stage driver 853 to rotation-drive the stage 852, and a cleaning head 851 arranged vertically directly above the stage 852 and configured to discharge water vertically downward. In this configuration, the stage 852 is a sheet holder that includes a sucker to suck a sheet TE and sucks and holds the sheet TE on which a plurality of chips CP is stuck and that is held by the ring-shaped frames RI2 and RI3. Note that the stage 852 may be a stage that holds not only the sheet TE but also the ring-shaped frames RI2 and RI3. The cleaning device 85 subjects a plurality of chips CP to aqueous cleaning by, as illustrated in FIG. 7, for example, rotating the stage 852 in a direction illustrated by an arrow AR81 by the stage driver 853 with the ring-shaped frames RI2 and RI3 holding the sheet TE on which the plurality of chips CP is stuck supported by the stage 852 and also moving back and forth the cleaning head 851 in a radial direction of the substrate WD as illustrated by an arrow AR82 while discharging water from the cleaning head 851 toward the plurality of chips CP as illustrated by a dashed arrow.

Figure 8:
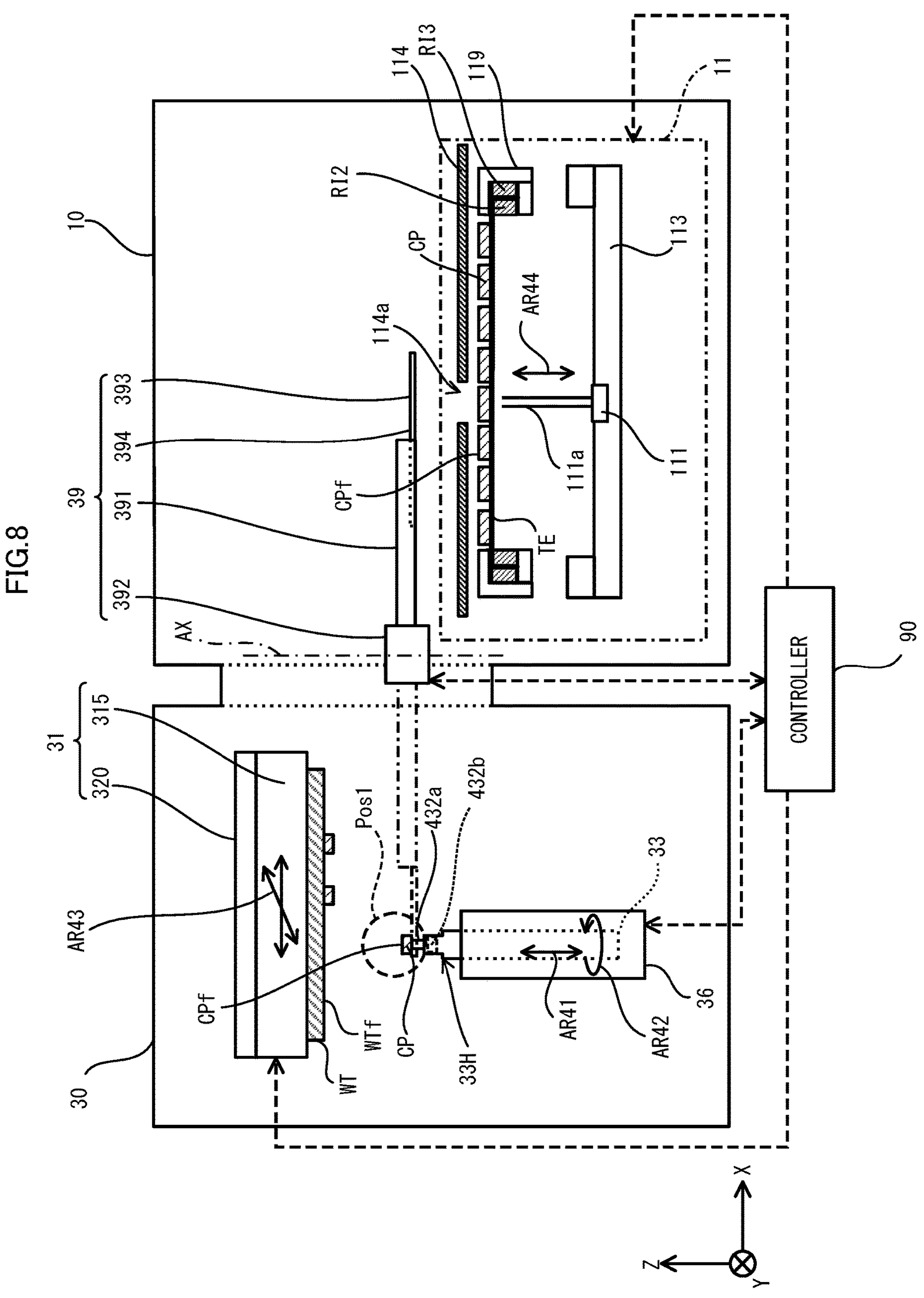
FIG. 8 is a schematic configuration diagram of a chip feeding device, a chip transportation device, and a bonding device according to the embodiment when viewed from a lateral side.

Returning to FIG. 1, the chip feeding device 10 picks a chip CP out of a plurality of chips CP that is stuck on a sheet TE held by the ring-shaped frames RI2 and RI3 and supplies the bonding device 30 with the picked chip CP. The chip feeding device 10 includes a chip feeder 11, as illustrated in FIG. 8. The chip feeder 11 includes a frame support 119, a pickup mechanism 111 to pick up a chip CP out of a plurality of chips CP, and a cover 114. In this configuration, the frame support 119 is a second frame support that supports the ring-shaped frames RI2 and RI3 holding a sheet TE on which a plurality of chips CP is stuck. Note that the frame support 119 may support only the ring-shaped frame RI2 or may be a support that supports only the ring-shaped frame RI3. In addition, the chip feeder 11 includes a frame driver 113 that drives the ring-shaped frames RI2 and RI3 in XY directions or in the rotational direction about the Z-axis. The frame support 119 holds the ring-shaped frames RI2 and RI3 in such an attitude that a surface of the sheet TE on which the plurality of chips CP is stuck faces the vertically upper (+Z-direction) side.

The pickup mechanism 111 brings one chip CP among the plurality of chips CP into a state of being detached from the sheet TE by pushing out the one chip CP from the opposite side to the side of the sheet TE on which the plurality of chips CP is stuck. In this configuration, the pickup mechanism 111 cuts out a chip CP while holding a peripheral portion of the opposite side to the bonding surface CPf side of the chip CP, the peripheral portion, which is a third part, being different from a central portion, which is a first part, of the opposite side that is to be held by a head 33H, which is described later. The pickup mechanism 111 includes needles 111*a* and is configured to be movable in the vertical direction, as illustrated by an arrow AR44 in FIG. 8. The cover 114 is arranged to cover the vertically upper side of the plurality of chips CP and has a hole 114*a* disposed at a portion facing the pickup mechanism 111. The needles 111*a* are, for example, provided in a number of four. However, the number of the needles 111*a* may be three or five or more. The pickup mechanism 111 feeds a chip CP by sticking the needles 111*a* into the sheet TE from the vertically lower (−Z-direction) side of the sheet TE and raising the chip CP vertically upward (+Z-direction). The respective chips CP stuck on the sheet TE are pushed out to the upper side of the cover 114 through the hole 114*a* of the cover 114 one by one by the needles 111*a* and handed over to the chip transportation device 39. The frame driver 113 changes the position of a chip CP located vertically directly above the needles 111*a* by driving the ring-shaped frames RI2 and RI3 in an XY direction or a rotational direction about the Z-axis.

The chip transportation device (also referred to as a turret) 39 transports a chip CP fed from the chip feeder 11 to a handover position Pos1 at which the chip CP is handed over to the head 33H of a bonder 33 in the bonding device 30. The chip transportation device 39 includes two long plates 391, two arms 394, two chip holders 393 each of which is disposed at a tip portion of one of the arms 394, and a plate driver 392 that rotation-drives the two plates 391 at the same time, as illustrated in FIG. 1. Each of the two plates 391 is formed in a long rectangular box shape, and one end portion of the plate 391 turns with the other end portion thereof, which is located at the middle between the chip feeder 11 and the head 33H, as a fulcrum. The two plates 391 are arranged in such a manner that, for example, the longitudinal directions thereof make an angle of 90 degrees with each other. Note that the number of the plates 391 is not limited to two and may be three or more.

Figure 9A:
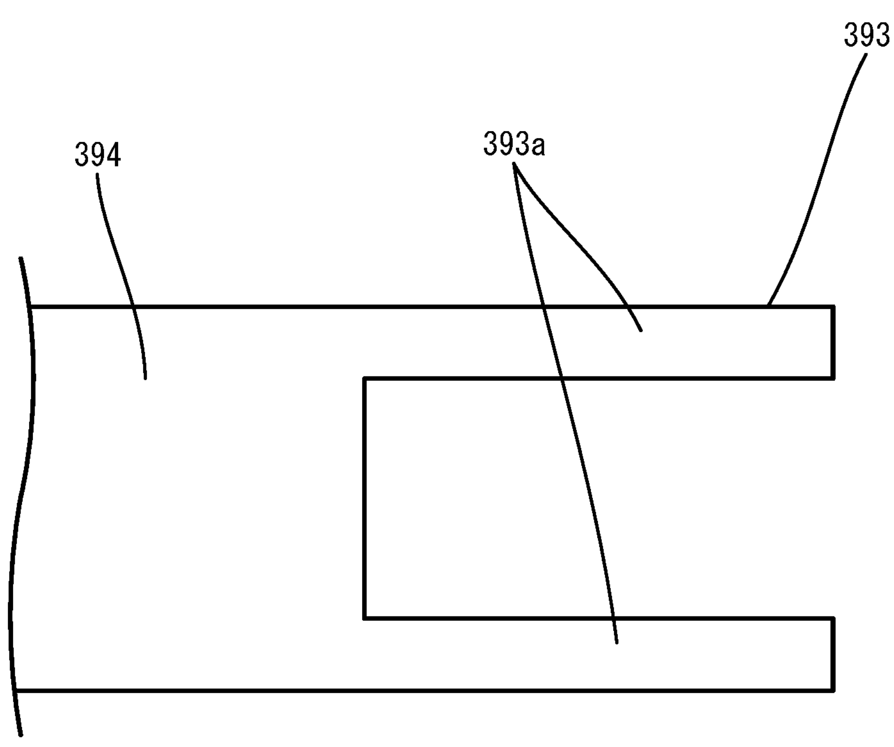
FIG. 9A is a plan view of a chip holder according to the embodiment.
Figure 9B:
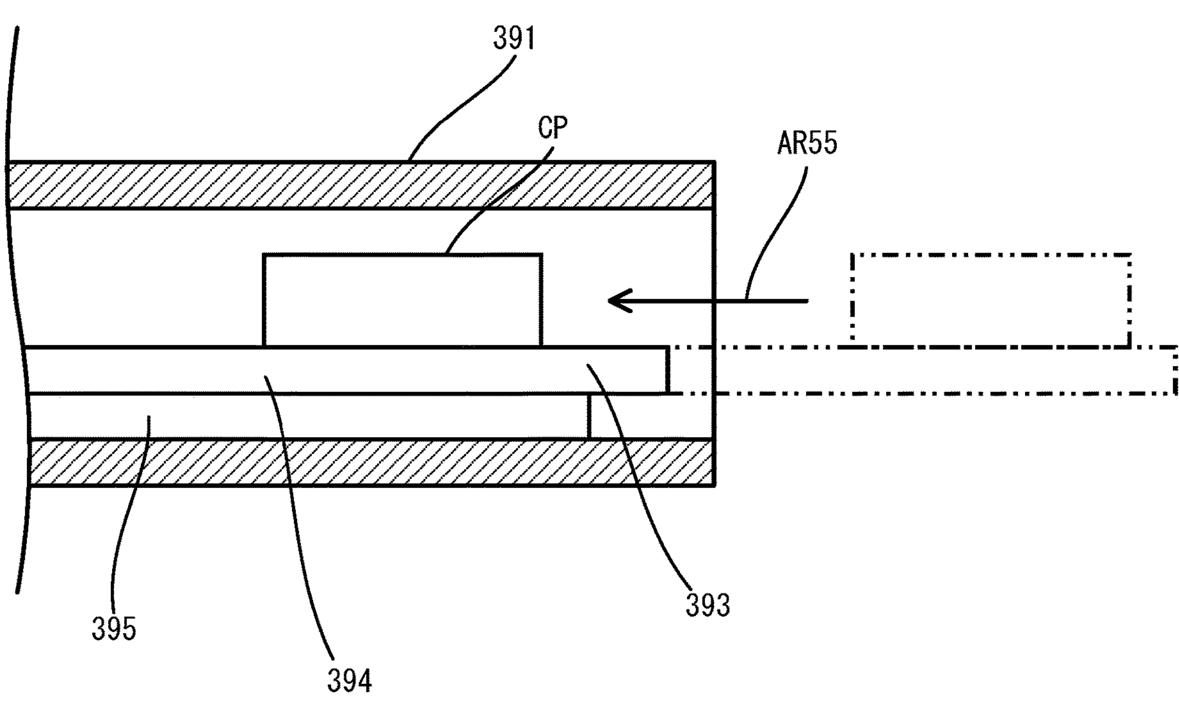
FIG. 9B is a cross-sectional view illustrating a portion of the chip transportation device according to the embodiment.

Each of the chip holders 393 is a second object-to-be-bonded holder that is disposed at a tip portion of one of the arms 394 and has two leg pieces 393*a* to hold a chip CP, as illustrated in FIG. 9A. Each of the plates 391 is capable of housing the long arm 394 on the inside thereof, as illustrated in FIG. 9B. On the inside of the plate 391, an arm driver 395 that drives the arm 394 along the longitudinal direction of the plate 391 is disposed. This configuration enables the chip transportation device 39 to, using each of the arm drivers 395, bring the tip portion of one of the arms 394 to a state of being projected to the outside of one of the plates 391 or bring the tip portion of the arm 394 to a state of being retracted into the inside of the plate 391. When the chip transportation device 39 turns the plates 391, the chip transportation device 39 retracts the arms 394 into the plates 391 and thereby houses the chip holders 393 on the inside of the plates 391, as illustrated by an arrow AR55 in FIG. 9B. This configuration enables adherence of particles onto a chip CP at the time of transportation to be prevented. Note that suction grooves (not illustrated) may be disposed on the two leg pieces 393*a*. In this case, since a chip CP is sucked and held by the leg pieces 392*a*, it is possible to transport the chip CP without misalignment. In order to prevent a chip CP from being thrown out due to centrifugal force induced when the plates 391 turn, protrusions (not illustrated) may be disposed at the tip portions of the leg pieces 393*a*.

As illustrated in FIG. 1, the pickup mechanism 111 and the head 33H are arranged at positions that overlap an orbit OB1 drawn by the tip portions of the arms 394 when the plates 391 turn, as viewed in the Z-axis direction. When the chip transportation device 39 receives a chip CP from the pickup mechanism 111, the chip transportation device 39 turns the plate 391 about an axis AX and thereby transports the chip CP to the handover position Pos1, which overlaps the head 33H, as illustrated by an arrow AR12 in FIG. 1.

Figure 10A:
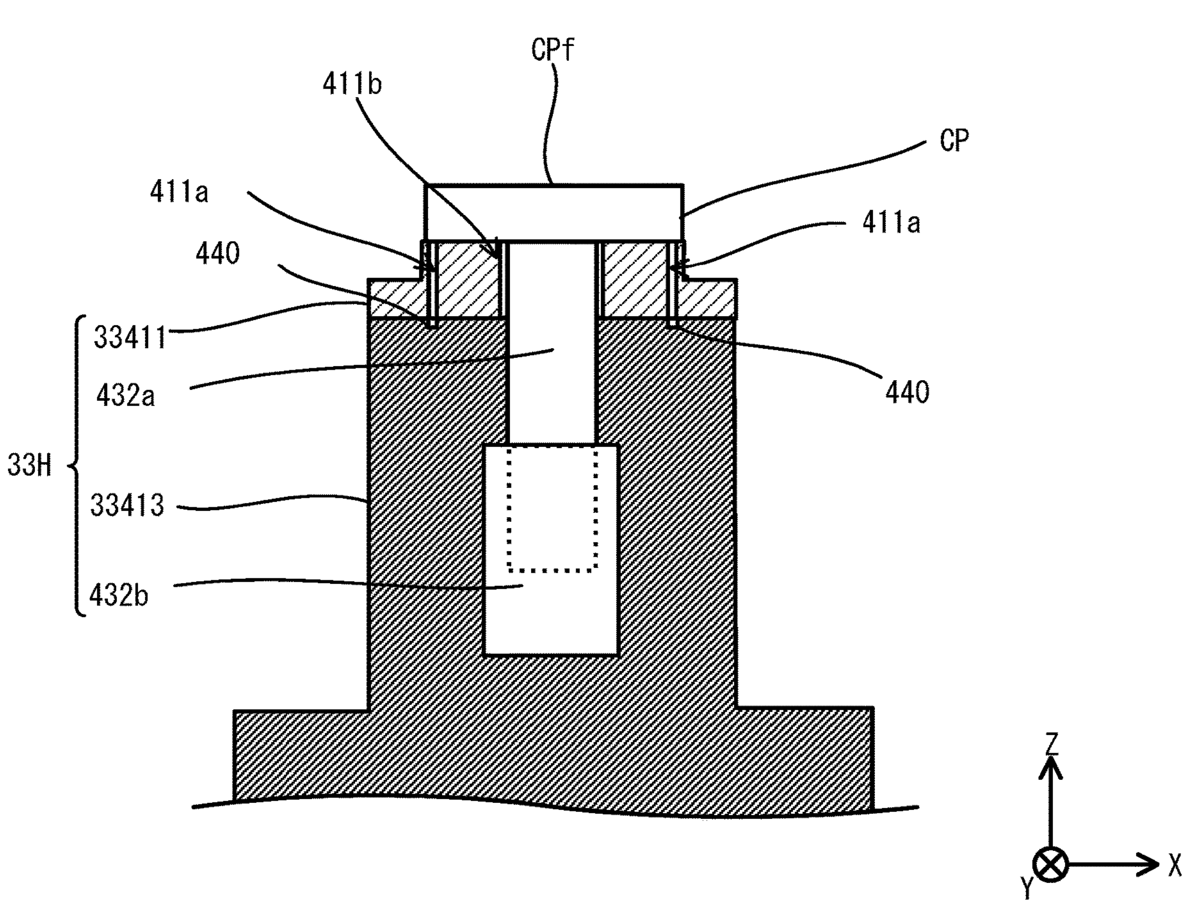
FIG. 10A is a cross-sectional view illustrating a head of the bonding device according to the embodiment.

The bonding device 30 is a chip bonding device that includes a stage unit 31, the bonder 33 including the head 33H, and a head driver 36 to drive the head 33H. The head 33H includes a chip tool 33411, a head body 33413, a chip support 432*a*, and a support driver 432*b*, as illustrated in, for example, FIG. 10A. The chip tool 33411 is formed of, for example, silicon (Si). The head body 33413 includes holding mechanisms 440 including suckers to cause a chip CP to be sucked and held to the chip tool 33411 and a sucker (not illustrated) to fix the chip tool 33411 to the head body 33413 by means of vacuum suction. In addition, a ceramic heater, a coil heater, or the like is incorporated into the head body 33413. The chip tool 33411 includes through-holes 411*a* formed at positions corresponding to the holding mechanisms 440 of the head body 33413 and a through-hole 411*b* into the inside of which the chip support 432*a* is inserted.

Figure 10B:
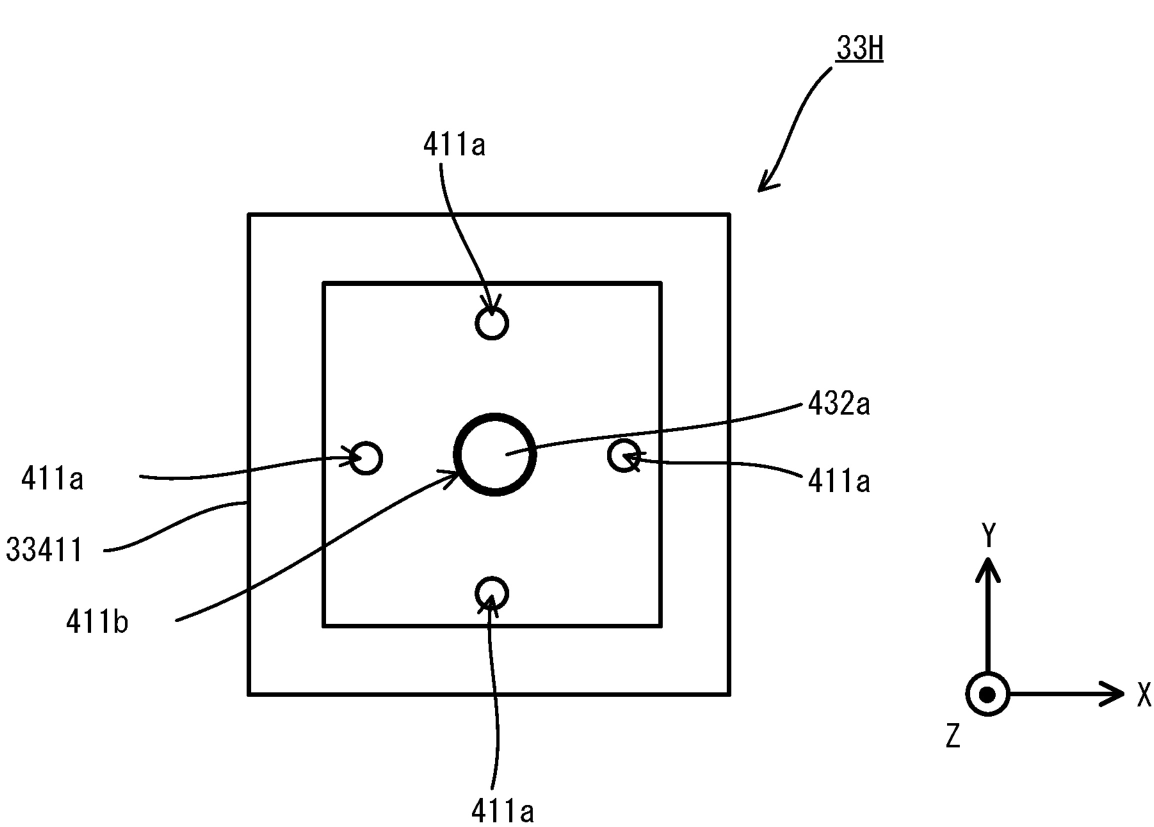
FIG. 10B is a plan view illustrating the head of the bonding device according to the embodiment.

The chip support 432*a* is, for example, a cylindrical sucking post and is a component support that is disposed at the tip portion of the head 33H and is freely movable in the vertical direction. The chip support 432*a* supports the central portion, which is the first part, of the opposite side to the bonding surface CPf side of a chip CP. The chip support 432*a* is disposed alone at the central portion, as illustrated in, for example, FIG. 10B.

The support driver 432*b* drives the chip support 432*a* in the vertical direction and also causes a chip CP to be sucked on a tip portion of the chip support 432*a* by decompressing the inside of the chip support 432*a* with the chip CP placed on the tip portion of the chip support 432*a*. The support driver 432*b* moves the chip support 432*a* to the vertically upper side of one of the chip holders 393 of the chip transportation device 39 with the chip holder 393 holding the chip CP and being positioned at the handover position (see Pos1 in FIG. 1) to the head 33H and the chip support 432*a* supporting the central portion of the chip CP on the tip portion thereof. This movement causes the chip CP to be transferred from the chip holder 393 of the chip transportation device 39 to the head 33H.

The head driver 36 is a relative position changer that brings the head 33H holding a chip CP having been transferred at the handover position Pos1 (see FIG. 8) close to a stage 315 by moving the head 33H vertically upward (+Z-direction) and mounts the chip CP on the mounting surface WTf of the substrate WT. More in detail, the head driver 36, by moving the head 33H holding a chip CP vertically upward (+Z-direction) and thereby bringing the head 33H close to the stage 315 and bringing the flat bonding surface CPf of the chip CP into surface contact with the flat mounting surface WTf of the substrate WT, causes the chip CP to be bonded to the substrate WT. In this configuration, the “flat mounting surface WTf” and the “flat bonding surface CPf” means that the mounting surface WTf and the bonding surface CPf are surfaces having substantially no unevenness and having an RA of 1 μm or less. For example, when an unevenness of approximately 1 μm exists on the bonding surface CPf of a chip CP or the mounting surface WTf of a substrate WT, there is a possibility that a void is generated in the surroundings of the unevenness. Thus, the RA of the bonding surface CPf of a chip CP or the mounting surface WTf of a substrate WT is preferably 1 μm or less. By this time, the mounting surface WTf of the substrate WT and the bonding surface CPf of the chip CP to be bonded to the substrate WT have been subjected to activation treatment by the activation treatment device 60. In addition, the mounting surface WTf of the substrate WT, after having been subjected to the activation treatment, has been subjected to aqueous cleaning by the cleaning device 85. Therefore, bringing the bonding surface CPf of the chip CP into contact with the mounting surface WTf of the substrate WT causes the chip CP to be bonded to the substrate WT through so-called hydrophilic bonding via hydroxyl groups (OH groups).

The stage unit 31 includes the stage 315 that holds a substrate WT in such an attitude that the mounting surface WTf of the substrate WT on which a chip CP is mounted faces vertically downward (−Z-direction) and a stage driver 320 that drives the stage 315. The stage 315 is a substrate holder that is capable of moving in the X-direction, the Y-direction, and the rotational direction. This configuration enables a relative positional relationship between the bonder 33 and the stage 315 to be changed and a mounting position of each chip CP on the substrate WT to be thereby adjusted.

Returning to FIG. 1, the controller 90 is, for example, a programmable logic controller and includes a central processing unit (CPU) unit and an input/output control unit. The controller 90 is connected to the chip feeding device 10, the chip transportation device 39, the bonding device 30, the cleaning device 85, the activation treatment device 60, and the transportation robot 71. The controller 90, by outputting a control signal to each of the chip feeding device 10, the chip transportation device 39, the bonding device 30, the cleaning device 85, the activation treatment device 60, and the transportation robot 71, controls operation thereof.

Figure 11:
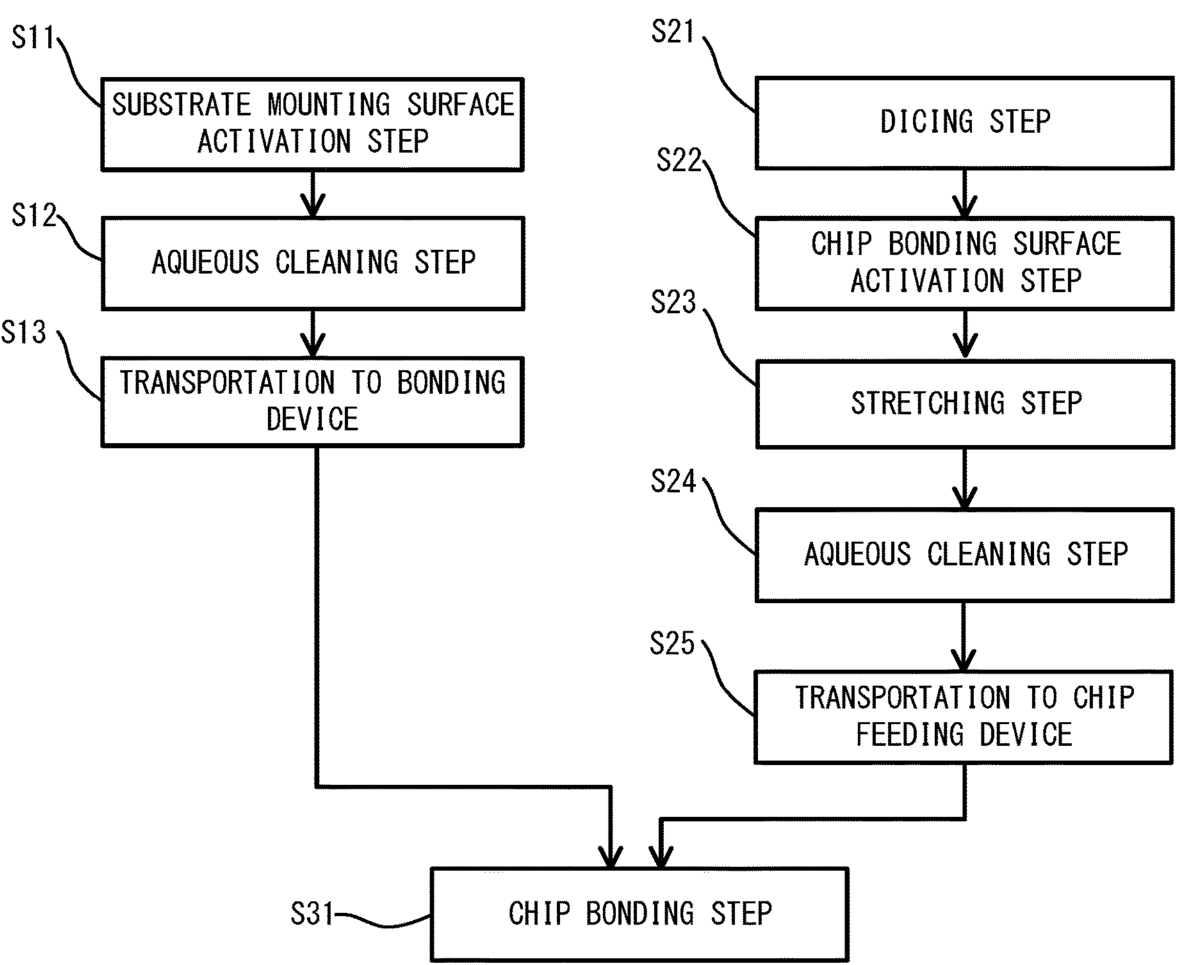
FIG. 11 is a flowchart illustrating an example of a flow of a chip bonding method according to the embodiment.

Next, operation of the chip bonding system 1 according to the present embodiment is described, referring to FIGS. 11 to 13. First, the chip bonding system 1, by inputting a substrate WT having been input from the carrying in/out unit 80 to the activation treatment device 60, performs a substrate mounting surface activation step of subjecting the mounting surface WTf of the substrate WT to the activation treatment, as illustrated in FIG. 11 (step S11). In this step, the activation treatment device 60 performs the activation treatment with the substrate WT supported by the sheet support 612 in such an attitude that the mounting surface WTf of the substrate WT faces vertically upward.

Next, the chip bonding system 1, by inputting the substrate WT having been subjected to the activation treatment by the activation treatment device 60 to the cleaning device 85, performs an aqueous cleaning step of subjecting the mounting surface WTf of the substrate WT to the aqueous cleaning (step S12). The aqueous cleaning step is equivalent to a substrate mounting surface cleaning step of cleaning the mounting surface WTf of the substrate WT. In this step, the cleaning device 85 subjects the substrate WT to the aqueous cleaning by, while rotating the stage 852 by the stage driver 853 with the substrate WT supported by the stage 852, discharging water onto the substrate WT from the cleaning head 851. Through this processing, the mounting surface WTf of the substrate WT is brought into a state in which a relatively large number of hydroxyl groups (OH groups) or water molecules adhere to the mounting surface WTf. Succeedingly, the chip bonding system 1 transports the substrate WT after cleaning to the bonding device 30 (step S13). On this occasion, the bonding device 30 causes the stage 315 to hold the received substrate WT. Specifically, the transportation robot 71 receives, from the cleaning device 85, the substrate WT in such an attitude that the mounting surface WTf thereof faces vertically upward. Subsequently, the transportation robot 71 turns over the received substrate WT and holds the substrate WT in such an attitude that the mounting surface WTf thereof faces vertically downward. Then, the transportation robot 71 transfers the substrate WT to the stage 315 of the bonding device 30 with the substrate WT kept in such an attitude that the mounting surface WTf thereof faces vertically downward.

In addition, in parallel with the afore-described processing, the dicing device 20 performs a dicing step of, by dicing a dicing substrate WD stuck on a sheet TE, generating a plurality of chips CP that is stuck on the sheet TE with chips adjacent to each other joined to each other via remaining uncut portions (step S21). After the dicing step, the ring-shaped frame RI1 holding the sheet TE on which the plurality of chips CP joined to one another via remaining uncut portions is stuck is input to the carrying in/out unit 80. Then, the chip bonding system 1 inputs the ring-shaped frame RI1 input from the carrying in/out unit 80 to the activation treatment device 60. Subsequently, the activation treatment device 60 performs a chip bonding surface activation step of activating the bonding surfaces CPf of the respective ones of the plurality of chips CP that is stuck on the sheet TE with chips adjacent to each other joined to each other via remaining uncut portions (step S22). After the chip bonding surface activation step, the transportation robot 71 takes out the ring-shaped frame RI1 holding the sheet TE on which the plurality of chips CP joined to one another via remaining uncut portions is stuck from the activation treatment device 60 and returns the ring-shaped frame RI1 to the carrying in/out unit 80 again.

Next, when, to the sheet stretching device 40, the ring-shaped frame RI1 that was taken out from the carrying in/out unit 80 and holds the sheet TE after the chip bonding surface activation step on which the plurality of chips CP is stuck is input, a stretching step of, by stretching the sheet TE, bringing the plurality of chips CP into a state of being separated from one another is performed (step S23). In addition, in the stretching step, the ring-shaped frame RI3 is fitted onto the outer periphery of the ring-shaped frame RI2 with the sheet TE stretched from the central portion of the ring-shaped frame RI2 in a radial manner and the plurality of chips CP separated from one another. Through this processing, the sheet TE on which the plurality of chips CP that is separated from one another is stuck is brought into a state of being held by the ring-shaped frames RI2 and RI3. In addition, after the stretching step was performed, the sheet TE is cut off from the ring-shaped frame RI1. The ring-shaped frames RI2 and RI3 holding the sheet TE is input to the carrying in/out unit 80 again.

Succeedingly, the chip bonding system 1 inputs the ring-shaped frames RI2 and RI3 holding the sheet TE having been input to the carrying in/out unit 80 to the cleaning device 85 and performs an aqueous cleaning step of subjecting the bonding surfaces CPf of the respective ones of the plurality of chips CP to the aqueous cleaning (step S24).

Subsequently, the chip bonding system 1 transports the ring-shaped frames RI2 and RI3 holding the sheet TE after the aqueous cleaning step from the cleaning device 85 to the chip feeding device 10 (step S25). On this occasion, the transportation robot 71 receives, from the cleaning device 85, the ring-shaped frames RI2 and RI3 holding the sheet TE in such an attitude that the bonding surfaces CPf of the chips CP face vertically upward. Subsequently, the transportation robot 71 directly transfers the received ring-shaped frames RI2 and RI3 to the chip feeder 11 of the chip feeding device 10. Then, in the chip feeder 11, the frame support 119 is caused to support the transferred ring-shaped frames RI2 and RI3.

Figure 12A:
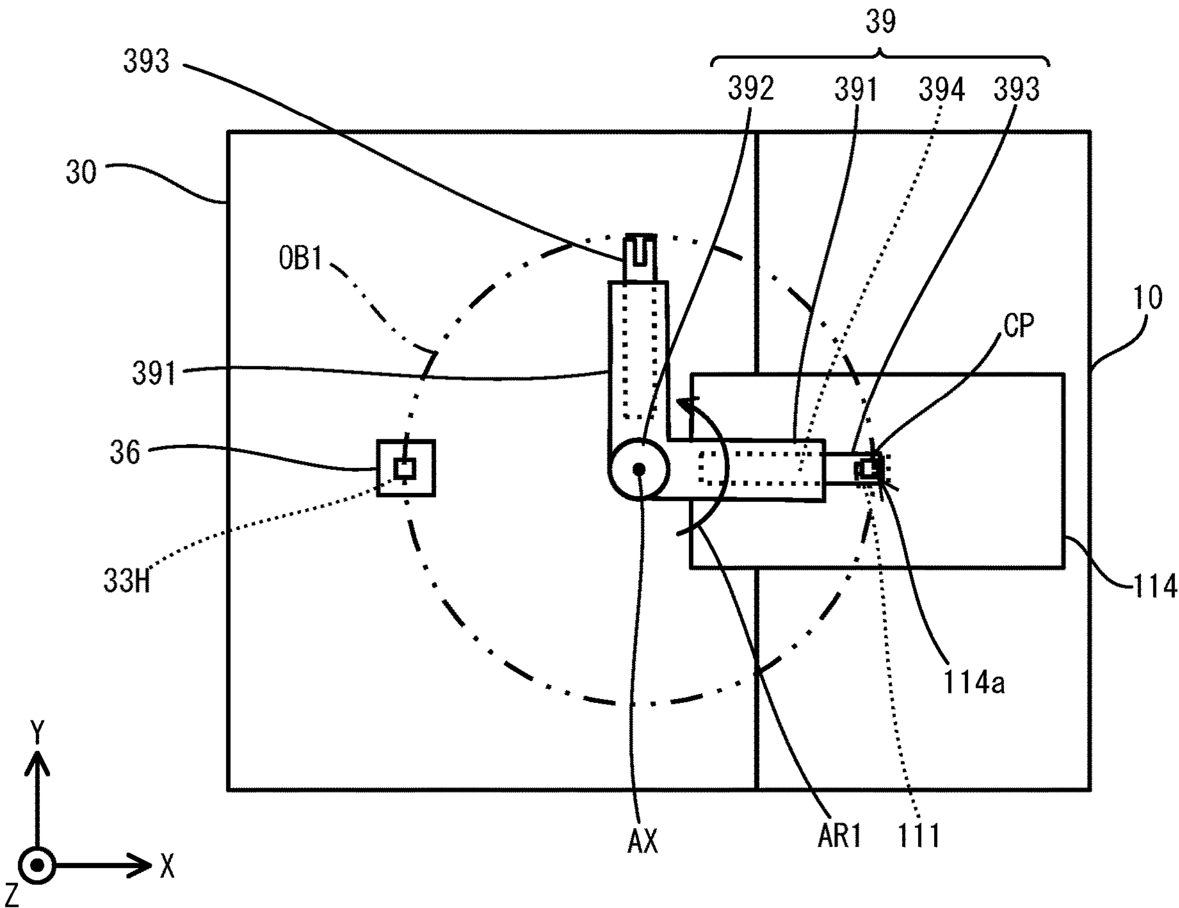
FIG. 12A is a schematic plan view illustrating a manner in which a chip is fed from a chip feeder in the chip bonding system according to the embodiment.
Figure 12B:
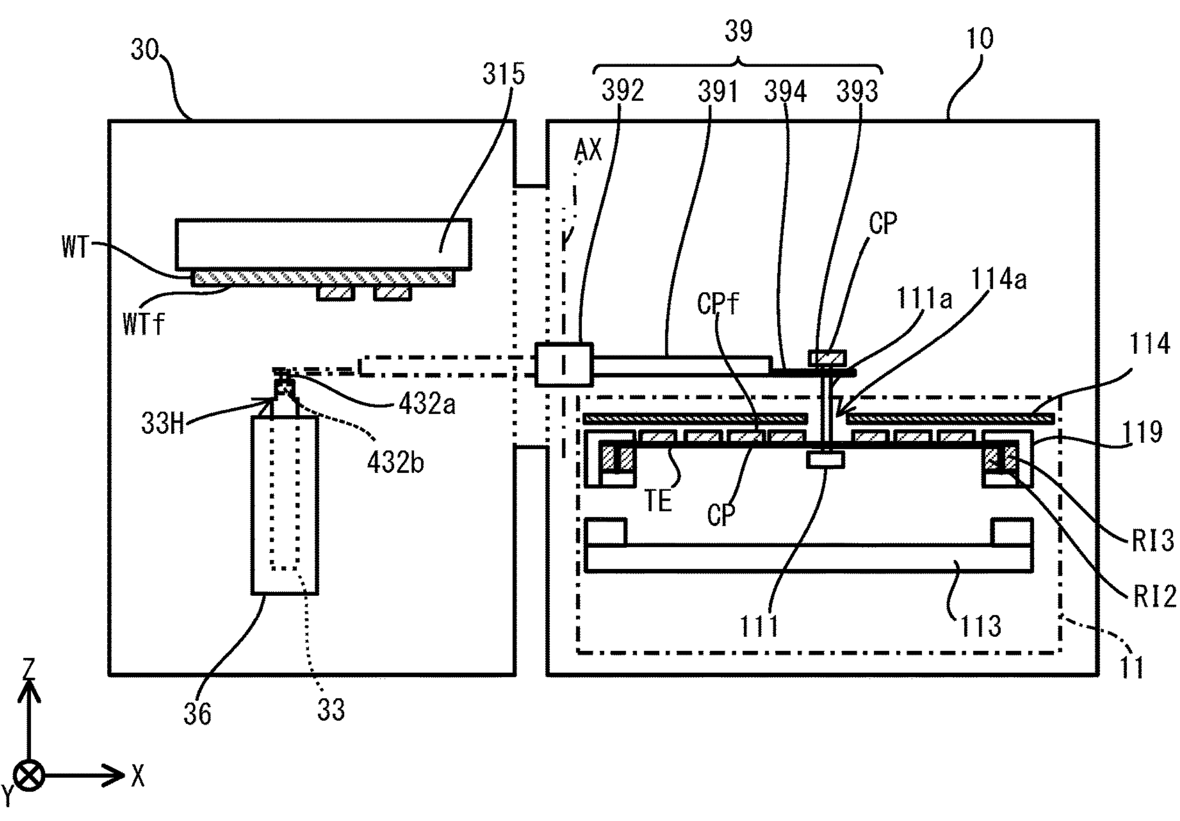
FIG. 12B is a schematic side view illustrating the manner in which the chip is fed from the chip feeder in the chip bonding system according to the embodiment.

Next, the chip bonding system 1 performs a chip bonding step of bonding a chip CP to the substrate WT by bringing the chip CP into contact with the mounting surface WTf of the substrate WT (step S31). In this step, the chip bonding system 1 first brings one plate 391 of the chip transportation device 39 into a state of being directed toward the chip feeder 11. Next, the pickup mechanism 111 performs a chip feeding step of, by moving vertically upward, pushing out one chip CP from the opposite side to the side of the sheet TE on which the plurality of chips CP is stuck and bringing the one chip CP into a state of being detached from the sheet TE. While the chip CP is in this state, the chip transportation device 39 projects the arm 394 out of the plate 391. On this occasion, the chip holder 393 and the pickup mechanism 111 are brought into a state in which the needles 111*a* of the pickup mechanism 111 are arranged between two leg pieces 393*a* of the chip holder 393. In this way, the chip holder 393 and the chip CP are brought into a state in which the chip CP can be transferred to the chip holder 393, as illustrated in FIGS. 12A and 12B. When the pickup mechanism 111 is moved vertically downward while the chip holder 393 and the chip CP are in this state, the chip CP is transferred to the chip holder 393.

Figure 13A:
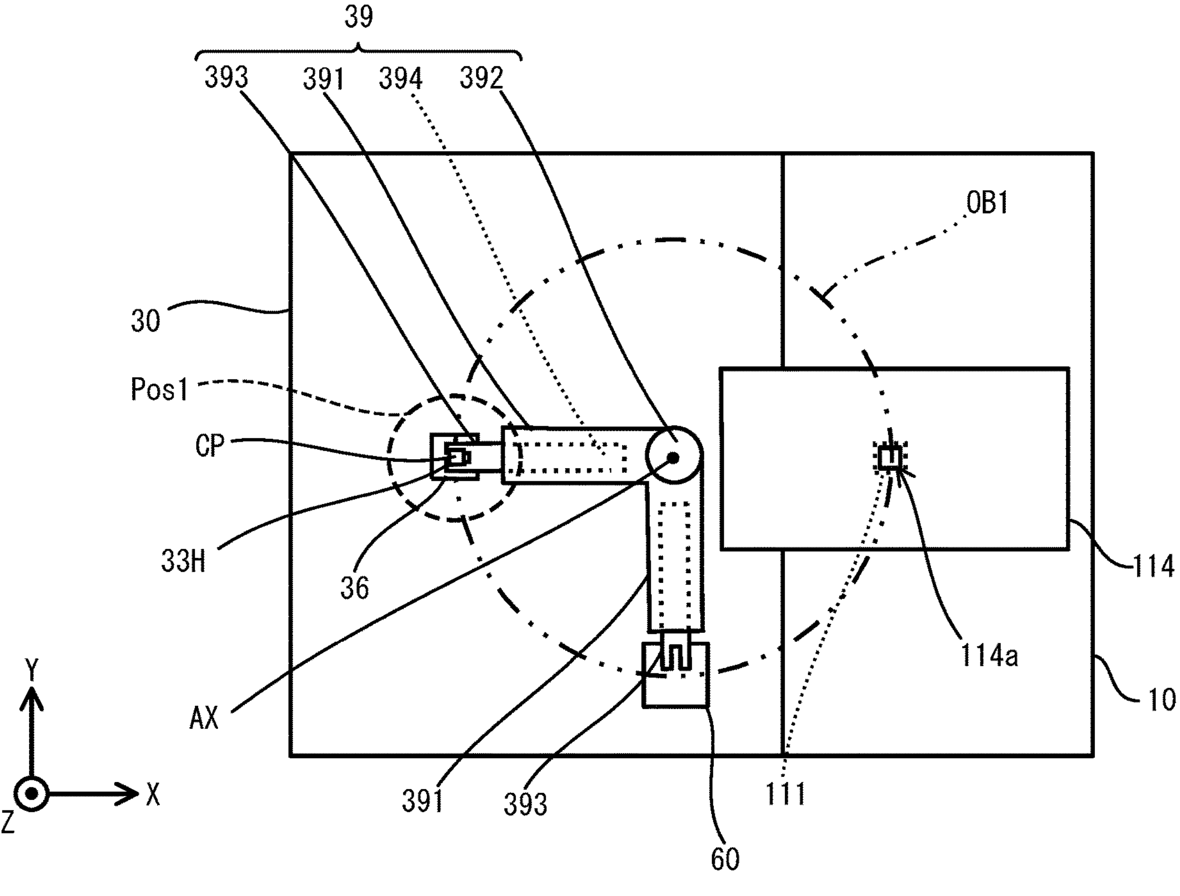
FIG. 13A is a schematic plan view illustrating a manner in which a chip is handed over from a chip transporter to the head in the chip bonding system according to the embodiment.
Figure 13B:
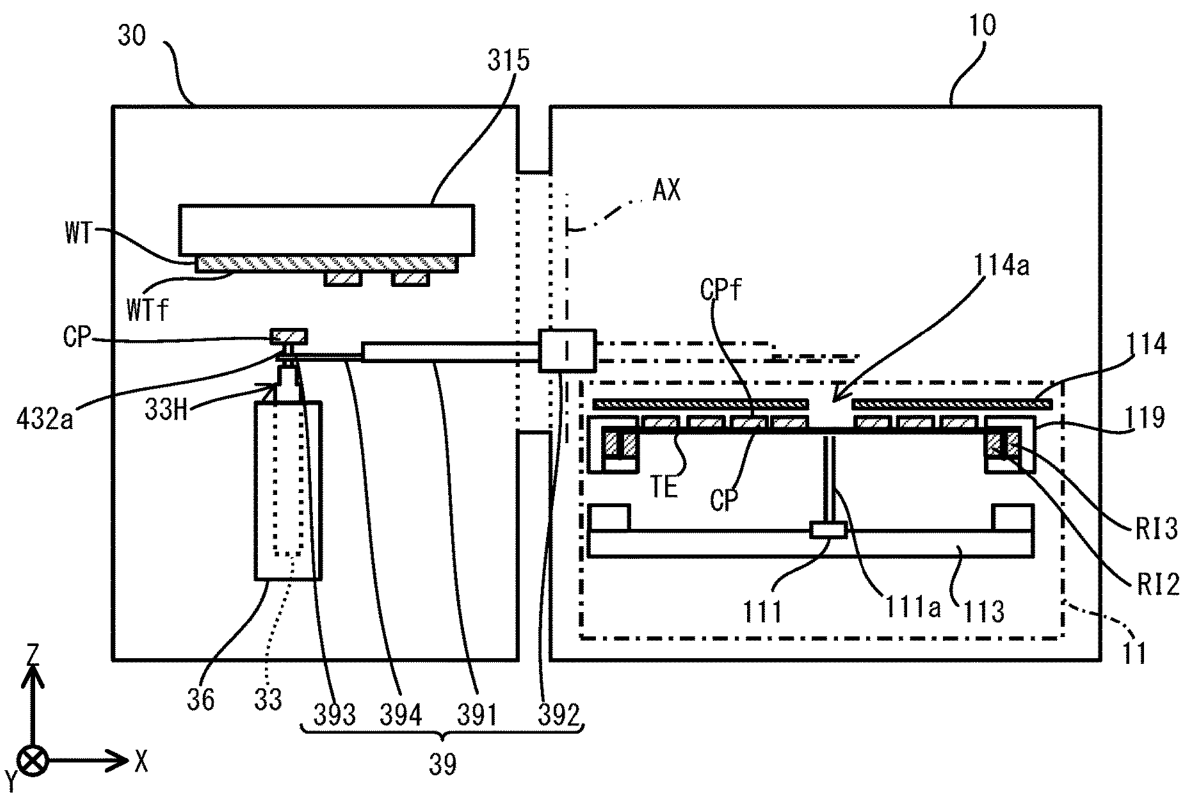
FIG. 13B is a schematic side view illustrating the manner in which the chip is handed over from the chip transporter to the head in the chip bonding system according to the embodiment.

Succeedingly, the chip bonding system 1 turns the plate 391 in the direction of an arrow AR1 in FIG. 12A. On this occasion, as illustrated in FIG. 13A, the chip holder 393 at the tip portion of the arm 394 of the chip transportation device 39 is arranged at a transfer position Pos1 vertically directly above the head 33H of the bonder 33. That is, the chip transportation device 39 transports the chip CP received from the chip feeder 11 to the transfer position Pos1 at which the chip CP is to be transferred to the head 33H. Then, the head driver 36 moves the bonder 33 vertically upward and brings the head 33H close to the chip holder 393 of the chip transportation device 39. Next, the support driver 432*b* moves the chip support 432*a* vertically upward. This movement causes the chip CP having been held by the chip holder 393 to be arranged on the vertically upper side of the chip holder 393 while being supported on the top end of the chip support 432*a*, as illustrated in FIG. 13B. Succeedingly, the chip transportation device 39 retracts the arm 394 into the plate 391. Subsequently, the support driver 432*b* moves the chip support 432*a* vertically downward. This processing brings the chip CP into a state of being held on the tip portion of the head 33H.

Subsequently, the chip bonding system 1, by driving the stage 315 and also rotating the bonder 33, performs alignment to correct relative misalignment between the chip CP and the substrate WT. The chip bonding system 1, by causing the head 33H to ascend, bonds the chip CP to the substrate WT. In this processing, the mounting surface WTf of the substrate WT and the bonding surface CPf of the chip CP are brought into a state of being bonded to each other through the hydrophilic bonding via hydroxyl groups (OH groups).

After the afore-described sequence of steps is finished, the substrate WT on which the chip CP is mounted is taken out from the chip bonding system 1 and is subsequently input to a heat treatment device (not illustrated) and subjected to heat treatment. The heat treatment device performs heat treatment of the substrate WT under the conditions of, for example, a temperature of 350° C. and a heating period of 1 hour.

As described in the foregoing, according to the chip bonding system 1 according to the present embodiment, the dicing device 20, by dicing a dicing substrate WD stuck on a sheet TE, generates a plurality of chips CP that is stuck on the sheet TE with chips CP adjacent to each other joined to each other via remaining uncut portions. The activation treatment device 60 activates bonding surfaces CPf of the respective ones of the plurality of chips CP that is stuck on the sheet TE while being joined to one another via remaining uncut portions. Since this configuration enables the activation treatment to activate the bonding surfaces CPf of the respective ones of the plurality of chips CP to be performed with the sheet TE not exposed from interspaces between the respective ones of the plurality of chips CP, it is possible to prevent impurities originating from the sheet TE from adhering to the bonding surfaces CPf of the respective ones of the plurality of chips CP. Therefore, occurrence of a bonding defect between a chip CP and a substrate WT caused by impurities having adhered to the bonding surface CPf of the chip CP can be prevented.

In the case where dicing is performed by the dicing device 20 after a dicing substrate WD is activated by the activation treatment device 60, cutting chips flow on the bonding surfaces CPf of chips CP along with cleaning fluid discharged to a contact region between the cutting blade 213 and the dicing substrate WD held by the holding table 215 and a vicinity of the contact region during dicing. On this occasion, there is a possibility that, due to the cutting chips and the cleaning fluid rubbing against the bonding surfaces CPf of the chips CP, effect of activation of the bonding surfaces CPf by the activation treatment device 60 disappears. Thus, the activation step by the activation treatment device 60 is required to be performed after the dicing step. In addition, since, when the activation step is performed by the activation treatment device 60, particles are generated in the activation step, it is required to clean the bonding surfaces CPf of the chips CP by the cleaning device 85 after the activation step in order to remove the particles. Further, in order to bond a chip CP to a substrate WT through hydrophilic bonding, it is required to supply water to the bonding surface CPf of the chip CP. Thus, performing the cleaning step after the activation step is essential. Because of these reasons, it is required to perform the dicing step, the activation step, the cleaning step, and the bonding step in this order.

In addition, since the dicing step and the activation step are required to be performed while chips CP adjacent to each other are in contact with or joined to each other as described afore, the cleaning step and the bonding step are required to be performed while chips CP adjacent to each other are separated from each other. For this reason, the dicing step and the activation step are performed with the sheet TE held by the ring-shaped frame RI1, and the cleaning step and the bonding step are performed with the sheet TE held by the ring-shaped frames RI2 and RI3. In addition, when, in the stretching step, chips CP joined to one another by remaining uncut portions are divided, particles are generated from the remaining uncut portions of the chips CP. For this reason, the stretching step is required to be performed before the cleaning step.

In addition, the dicing device 20 according to the present embodiment, by moving the cutting blade 213 along planned division lines located at the circumferences of portions corresponding to a plurality of chips CP on a dicing substrate WD and thereby forming cut trenches, generates the plurality of chips CP that is stuck on a sheet TE with chips CP adjacent to each other joined to each other via remaining uncut portions. Since, because of this configuration, cut trenches can be formed along planned division lines with high precision, it is possible to improve dimensional precisions of respective ones of the plurality of chips CP to be generated. The dicing device 20 according to the present embodiment also has an advantage that, by appropriately changing the type of cutting blade 213, the dicing device 20 can be applied to each of dicing substrates WD formed of a comparatively large number of types of materials.

Further, the activation treatment device 60 according to the present embodiment includes the cover 622 to, with the sheet TE supported by the sheet support 612, cover the sheet TE excluding a portion of the sheet TE on which a plurality of chips CP is stuck from a side of the sheet TE on which the plurality of chips CP is stuck. Since, because of this configuration, the sheet TE is prevented from being directly exposed to the plasma PSM, it is possible to reduce impurities originating from the sheet TE.

In addition, the activation treatment device 60 according to the present embodiment, by generating plasma PSM on the side of the sheet TE, which is supported by the sheet support 612, on which a plurality of chips CP is stuck, activates the bonding surfaces CPf of the respective ones of the plurality of chips CP. Since, because of this configuration, a large number of radicals can be generated, it is possible to accordingly generate a large number of OH groups contributing to hydrophilic bonding on the bonding surfaces CPf of the chips CP.

In the case where the cleaning step and the bonding step are performed with a sheet TE held by the ring-shaped frame RI1, when the sheet TE is transported to the cleaning device 85 after the sheet TE was stretched in the sheet stretching device 40 after the activation step, the stretched sheet TE is caused to contract again. In this case, there is a possibility that a plurality of chips CP separated from one another is caused to collide with one another in association with the contraction of the sheet TE and particles are thereby generated from the chips CP. In contrast, in the present embodiment, the dicing device 20 and the activation treatment device 60 perform processing with the sheet TE held by the ring-shaped frame RI1, and the cleaning device 85 and the chip feeding device 10 perform processing with the sheet TE held by the ring-shaped frames RI2 and RI3. Because of this configuration, after the sheet TE was stretched in the sheet stretching device 40 after the activation step, the sheet TE is held by the ring-shaped frames RI2 and RI3 while being kept stretched. Therefore, since the cleaning step and the bonding step are performed with the sheet TE kept stretched, generation of particles from the chips CP in association with the contraction of the sheet TE is prevented.

Figure 14A:
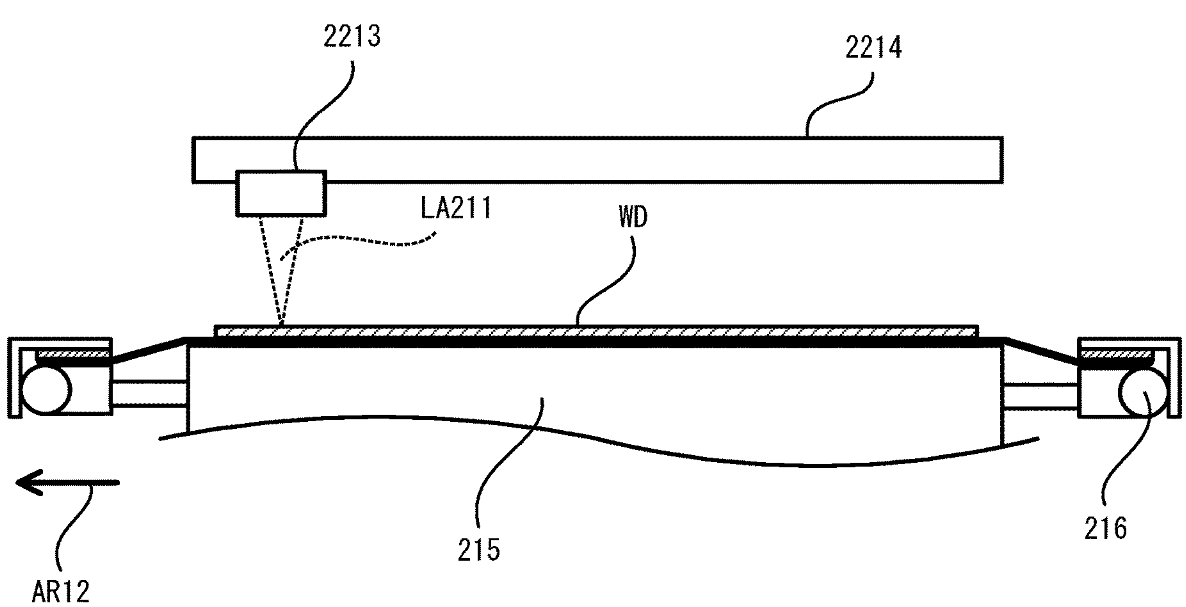
FIG. 14A is an operation explanatory diagram of a dicing device according to a variation.
Figure 14B:
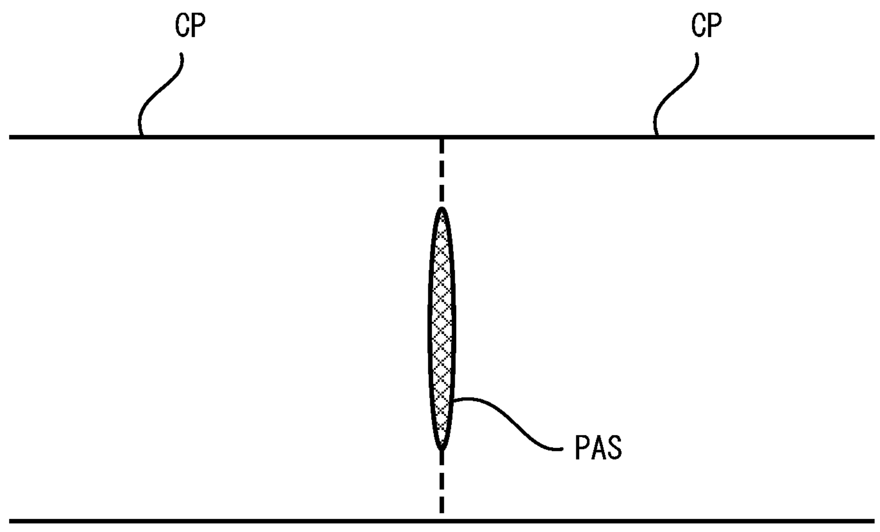
FIG. 14B is a cross-sectional view of a dicing substrate after a dicing step according to the variation.

Although the embodiment of the present disclosure was described above, the present disclosure is not limited to the configuration of the afore-described embodiment. For example, the dicing device 20 may be a dicing device that performs so-called stealth dicing. In this case, the dicing device may be a device that includes a laser processing head 2213, a laser processing head driver 2214, a holding table 215, and a chuck 216, as illustrated in, for example, FIG. 14A. Note that, in FIG. 14A, the same reference signs as those in FIG. 2A are assigned to the same constituent components as those in the embodiment. The laser processing head 2213 emits laser light with a wavelength that is transmitted through a dicing substrate WD. The laser processing head driver 2214 moves the laser processing head 2213 along planned division lines located at the circumferences of portions corresponding to a plurality of chips CP while maintaining distance between the laser processing head 2213 and the dicing substrate WD in such a manner that a converging point of the laser light is located at an internal point of the dicing substrate WD. This configuration causes a plurality of chips CP that is stuck on a sheet TE with chips adjacent to each other joined to each other via property altered spots PAS formed inside the dicing substrate WD to be generated, as illustrated in FIG. 14B.

In the dicing device 20 according to the embodiment, there is a possibility that microcracks are generated in a dicing substrate WD at the time of cutting or cut chips generated from the dicing substrate WD at the time of cutting adhere to the bonding surfaces of chips CP. In contrast, according to the present configuration, generation of microcracks in the dicing substrate WD is prevented. In addition, since no cut chip is generated, it is possible to reduce particles adhering to the bonding surfaces of chips CP. When a dicing substrate WD is diced using the dicing device 20 including the cutting blade 213 as in the embodiment, internal side surfaces of cut trenches on chips CP are comparatively rough and microcracks are likely to occur thereon. In this case, there is a possibility that, when a sheet TE is stretched and a plurality of chips CP is thereby brought into a state of being separated from one another, particles are generated due to microcracks having occurred at the time of dicing. In contrast, according to the present configuration, forming property altered spots PAS inside the dicing substrate WD at the time of dicing and subsequently stretching the sheet TE cause the plurality of chips CP to be divided by joint portions between chips CP adjacent to each other being cleaved with the property altered spots PAS as starting points. Thus, the present configuration also has an advantage that, compared with a case where dicing is performed using the dicing device 20 including the cutting blade 213, flatness of cut surfaces on the bonding surface CPf side of chips CP is high and an end edge portion of each chip CP is sharp. In addition, in the case where a chip CP is bonded to a substrate WT from the vertically lower side, since particles generated from a portion of the chip CP on the vertically lower side of the bonding surface CPf thereof fall vertically downward, such particles do not influence bonding of the chip CP to the substrate WT. Therefore, a combination of the present configuration and a method for bonding a chip CP to a substrate WT by bringing the chip CP close to the substrate WT from the vertically lower side of the substrate WT is effective as a method for generating a chip CP by dicing a dicing substrate WD and bonding the generated chip CP to the substrate WT.

In the embodiment, an example in which the activation treatment device 60 includes the plasma generator 615 to, by generating plasma PLM on the side of a sheet TE supported by the sheet support 612 on which a plurality of chips CP is stuck, activate the bonding surfaces CPf of the respective ones of the plurality of chips CP was described. However, the configuration of the activation treatment device 60 is not limited to the above example, and the activation treatment device may be an activation treatment device including a particle beam source to, by irradiating the side of a sheet supported by a sheet support on which a plurality of chips CP is stuck with a particle beam, activate the bonding surfaces CPf of the respective ones of the plurality of chips CP.

Figure 15:
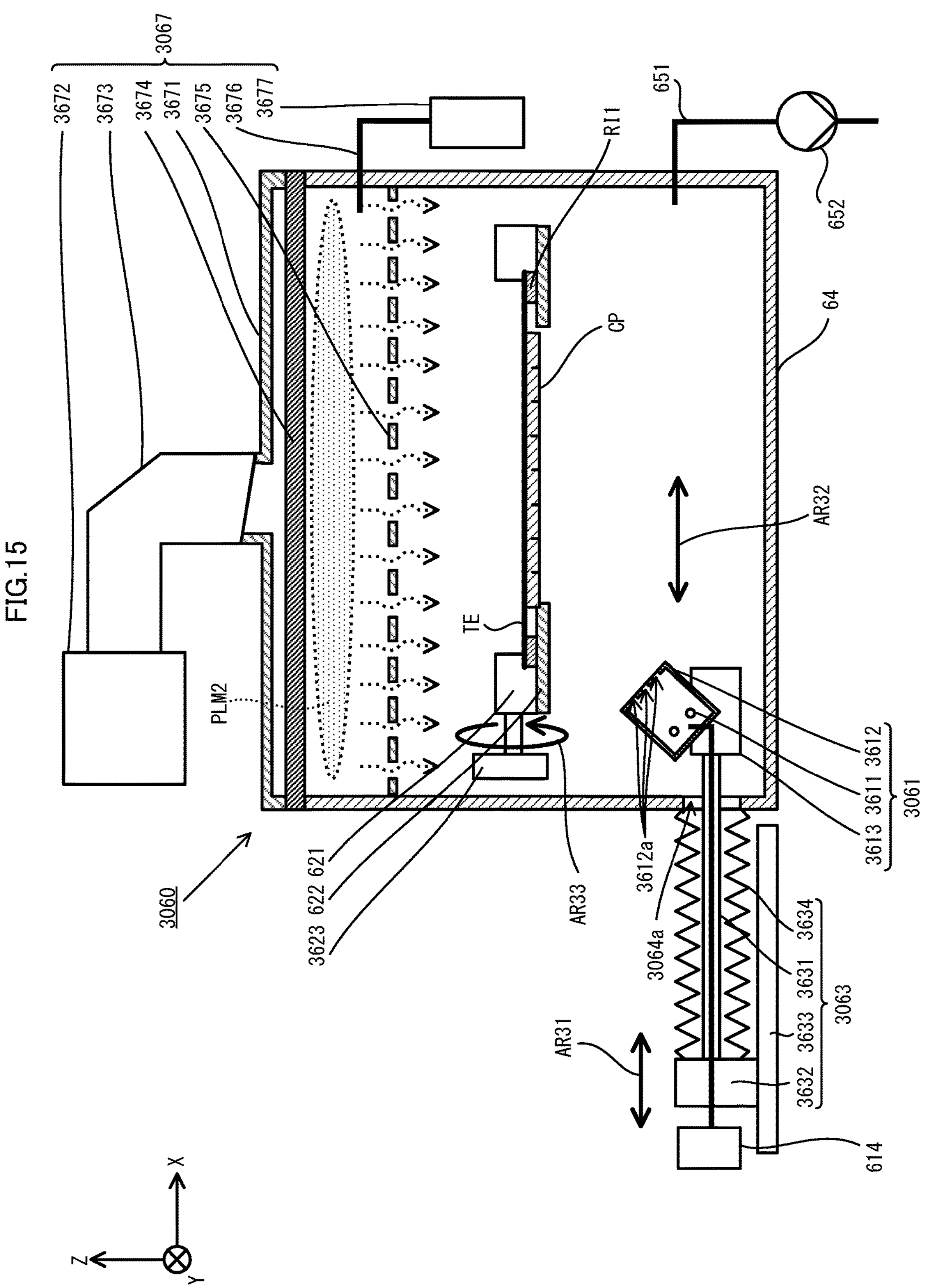
FIG. 15 is a schematic configuration diagram of an activation treatment device according to another variation.

An activation treatment device 3060 according to the present variation includes a chamber 64, a frame holder 621 to support the ring-shaped frame RI1, a cover 622, a particle beam source 3061, a beam source transporter 3063, and a radical source 3067, as illustrated in FIG. 15. Note that, in FIG. 15, the same reference signs as those in FIG. 3 are assigned to the same constituent components as those in the embodiment. The activation treatment device 3060 also includes a frame holder driver 3623 to support the frame holder 621 and rotation-drive the frame holder 621 about an axis orthogonal to the thickness direction thereof as illustrated by an arrow AR33 in FIG. 15. In addition, when a substrate WC is input, the frame holder 621 holds the substrate WC with a peripheral portion of the substrate WC held by the frame holder 621.

The particle beam source 3061 is, for example, a fast atom beam (FAB) source and includes a discharge chamber 3612, an electrode 3611 arranged in the discharge chamber 3612, a beam source driver 3613, and a gas feeder 614 to feed nitrogen gas into the discharge chamber 3612. In a peripheral wall of the discharge chamber 3612, FAB radiation ports 3612*a* for emitting neutral atoms are formed. The discharge chamber 3612 is formed of a carbon material. In this configuration, the discharge chamber 3612 is formed in a long box shape, and a plurality of FAB radiation ports 3612*a* is arranged side by side in a straight line in the longitudinal direction thereof. The beam source driver 3613 includes a plasma generator (not illustrated) to generate plasma of nitrogen gas in the discharge chamber 3612 and a DC power source (not illustrated) to apply DC voltage between the electrode 3611 and the peripheral wall of the discharge chamber 3612. The beam source driver 3613 applies DC voltage between the peripheral wall of the discharge chamber 3612 and the electrode 3611 with plasma of nitrogen gas generated in the discharge chamber 3612. On this occasion, nitrogen ions in the plasma are attracted to the peripheral wall of the discharge chamber 3612. On this occasion, nitrogen ions moving to the FAB radiation ports 3612*a* receive electrons from the peripheral wall of the discharge chamber 3612, which is formed of a carbon material, in outer peripheral portions of the FAB radiation ports 3612*a* at the time of passing through the FAB radiation ports 3612*a*. The nitrogen ions are converted to electrically neutralized nitrogen atoms and are discharged to the outside of the discharge chamber 3612.

The beam source transporter 3063 includes a support rod 3631 having a long length and inserted into a hole 3064*a* formed in the chamber 64 and configured to support the particle beam source 3061 at one end portion, a support base 3632 to support the support rod 3631 at the other end portion of the support rod 3631, and a support base driver 3633 to drive the support base 3632. The beam source transporter 3063 also includes a bellows 3634 interposed between the outer peripheral portion of the hole 3064*a* of the chamber 64 and the support base 3632 to maintain a degree of vacuum inside the chamber 64. The support base driver 3633, by driving the support base 3632 in directions in which the support rod 3631 is inserted and removed into and from the chamber 64 as illustrated by an arrow AR31 in FIG. 15, changes the position of the particle beam source 3061 in the chamber 64, as illustrated by an arrow AR32 in FIG. 15. In this configuration, the beam source transporter 3063 moves the particle beam source 3061 in a direction orthogonal to a direction in which the FAB radiation ports 3612*a* thereof are arranged side by side.

As the radical source 3067, an inductively coupled plasma (ICP) plasma source including a plasma chamber 3671, a glass window 3674, a trap plate 3675, a waveguide 3673, and a magnetron 3672 may be employed. The plasma chamber 3671 is connected to the waveguide 3673 via the glass window 3674. In addition, the radical source 3067 includes a gas feeder 3677 to feed nitrogen gas into the plasma chamber 3671 through a feeding pipe 3676. A microwave generated by the magnetron 3672 is fed into the plasma chamber 3671 through the waveguide 3673. As the magnetron 3672, for example, a magnetron that generates a microwave having a frequency of 2.45 GHz can be employed. In this case, power supplied from the magnetron 3672 to the plasma chamber 3671 is set to, for example, 2.5 kW. When a microwave is fed from the waveguide 3673 while nitrogen gas has been fed into the plasma chamber 3671, plasma PLM2 is formed in the plasma chamber 3671 by the microwave. The trap plate 3675 traps ions contained in the plasma PLM2 and allows only radicals to flow down into the chamber 64. That is, plasma is generated in the plasma chamber 3671 and only radicals contained in the plasma are allowed to flow down to the lower side of the plasma chamber 3671.

Note that the radical source 3067 is not limited to the configuration including the magnetron 3672 and the waveguide 3673 and may have a configuration including a flat plate electrode disposed over the glass window 3674 and a high-frequency power source electrically connected to the flat plate electrode. In this case, as the high-frequency power source, for example, a power source that applies a high-frequency bias having a frequency of 27 MHz can be employed. Power supplied from the high-frequency power source to the plasma chamber 3671 is set to, for example, 250 W. In addition, although, when a particle beam is radiated, pressure in the chamber 64 is evacuated to the order of $10^{-3}$ Pa using, for example, a turbomolecular pump, radical treatment is performed after the pressure in the chamber 64 is increased to approximately several tens of Pa.

Figure 16A:
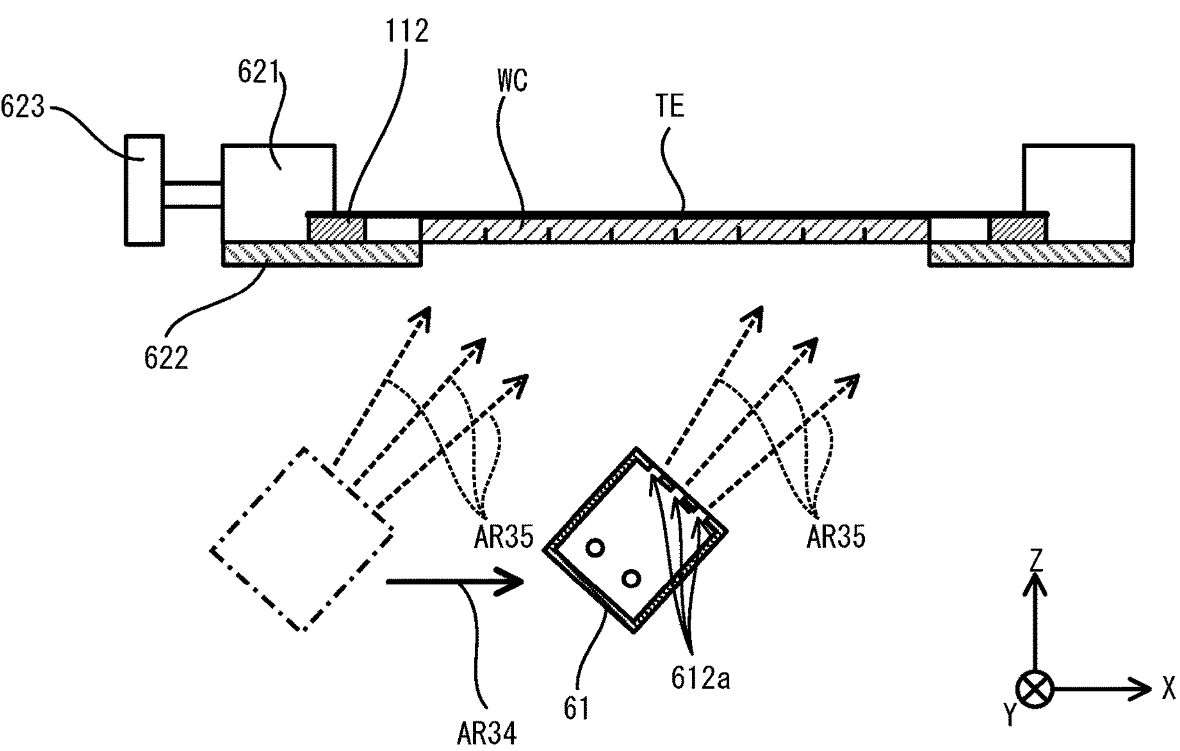
FIG. 16A is a schematic side view illustrating a manner in which a particle beam is radiated in the activation treatment device according to the another variation.
Figure 16B:
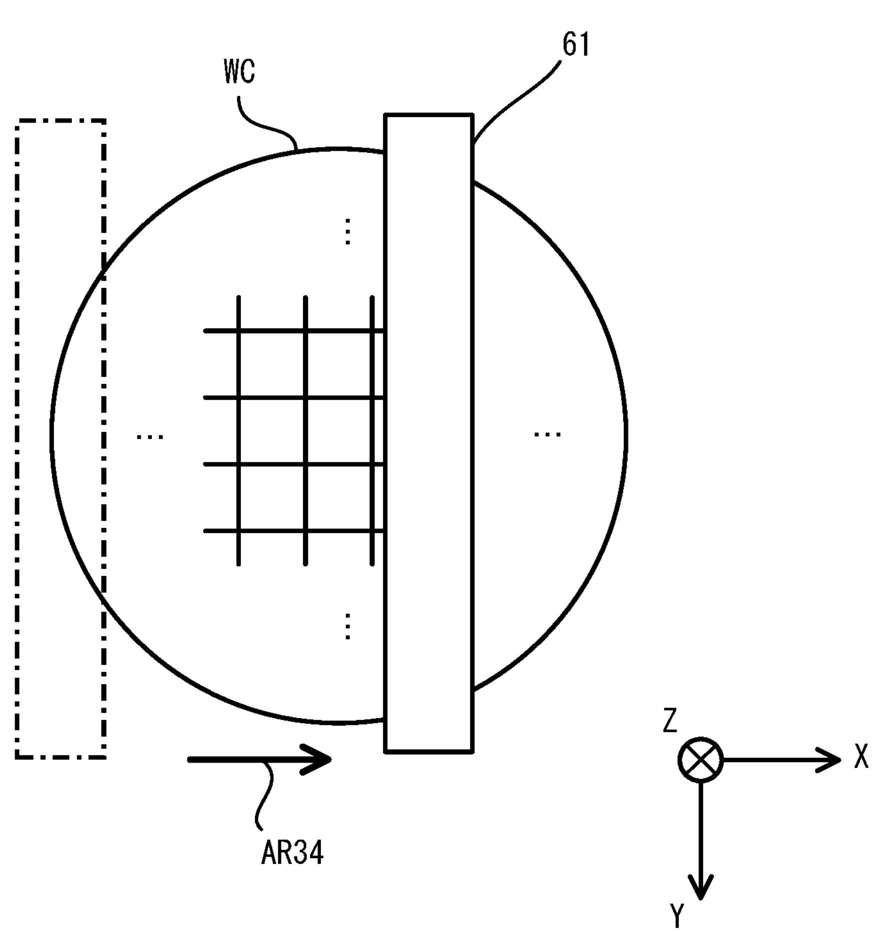
FIG. 16B is a schematic plan view illustrating the manner in which a particle beam is radiated in the activation treatment device according to the another variation.

The activation treatment device 3060 according to the present variation moves the particle beam source 3061 in the X-axis direction while causing the particle beam source 3061 to irradiate the bonding surfaces CPf of chips CP with a particle beam, as illustrated by, for example, an arrow AR34 in FIGS. 16A and 16B. In this processing, the activation treatment device 3060, for example, irradiates the bonding surfaces CPf of all the chips CP stuck on the sheet TE with a particle beam while moving the particle beam source 3061 in the +X-direction and subsequently irradiates the bonding surfaces CPf of the chips CP with a particle beam while moving the particle beam source 3061 in the −X-direction. In addition, movement speed of the particle beam source 3061 is set to, for example, 1.2 to 14.0 mm/sec. Further, supplied power to the particle beam source 3061 is set to, for example, 1 kV and 100 mA. The flow rate of nitrogen gas fed into the discharge chamber 3612 of the particle beam source 3061 is set to, for example, 100 sccm.

Figure 17A:
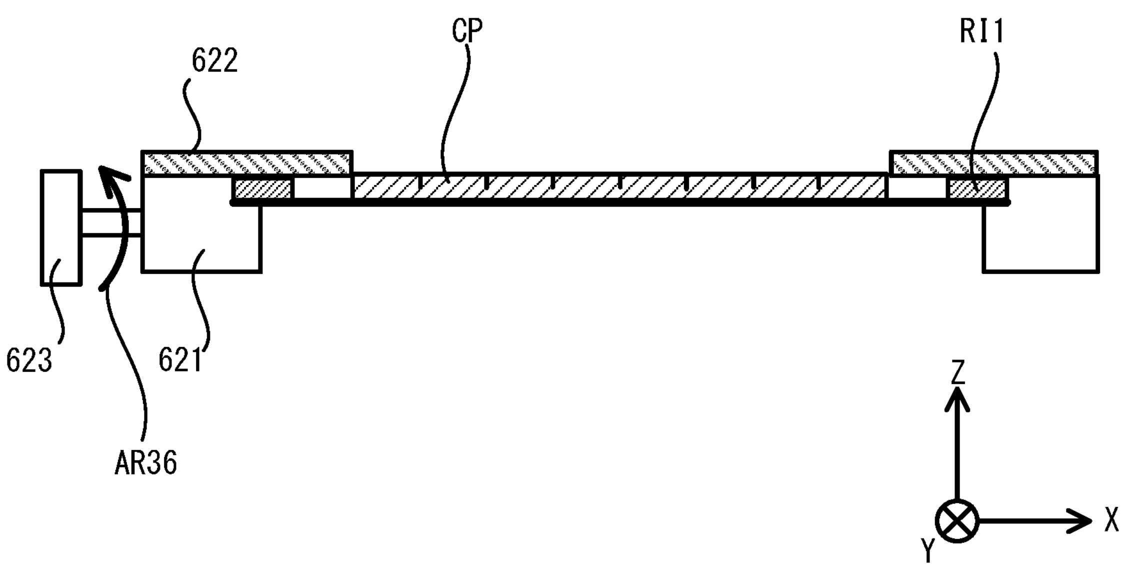
FIG. 17A is a schematic side view illustrating a manner in which the activation treatment device according to the another variation turns over a sheet.
Figure 17B:
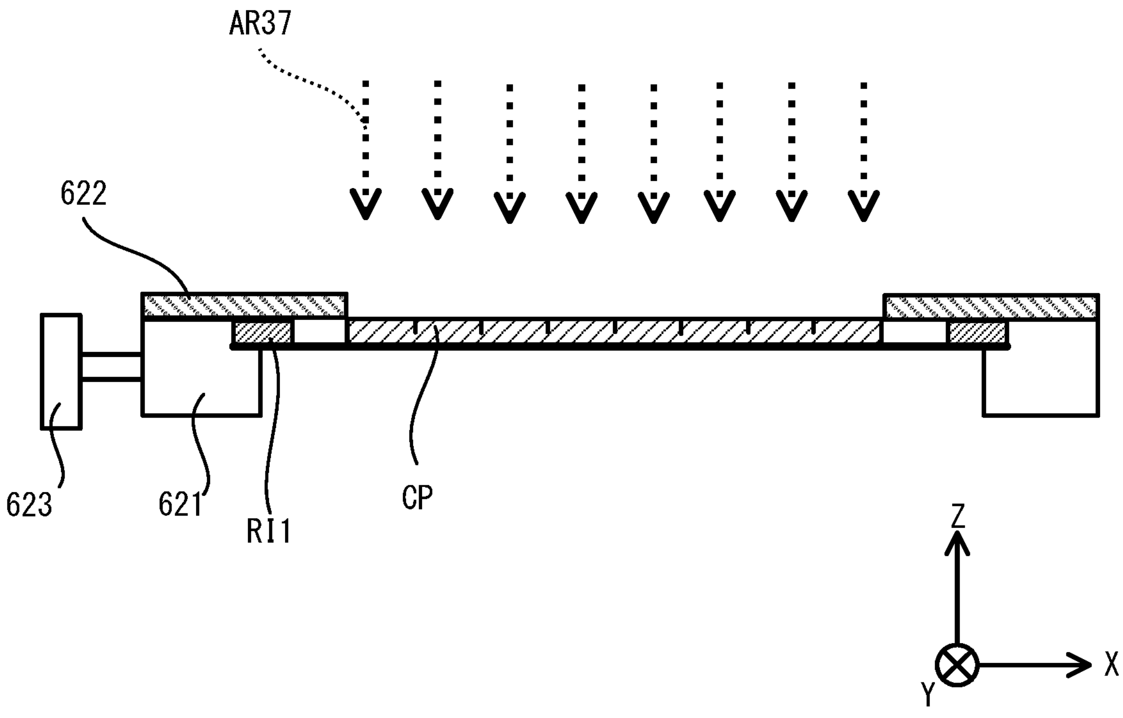
FIG. 17B is a schematic side view illustrating a manner in which the activation treatment device according to the another variation radiates nitrogen radicals.

Next, the activation treatment device 3060, by turning over the ring-shaped frame RI1 held by the frame holder 621 as illustrated by an arrow AR36 in FIG. 17A, brings the ring-shaped frame RI1 into such an attitude that the bonding surfaces CPf of the chips CP stuck on the sheet TE face vertically upward. The activation treatment device 3060 performs a second activation step in which the radical source 3067 irradiates the bonding surfaces CPf of the chips CP with nitrogen radicals as illustrated by arrows AR37 in FIG. 17B. In this configuration, the power supplied to the plasma chamber 3671, the flow rate of nitrogen gas fed into the plasma chamber 3671, and the irradiation period of nitrogen radicals in the radical source 3067 are set to, for example, the same conditions as those in the afore-described substrate mounting surface activation step.

According to the present configuration, the activation treatment by the particle beam irradiation and the activation treatment by the radical irradiation can be continuously performed on the mounting surface WTf of the substrate WT and the bonding surfaces CPf of the chips CP. In addition, in the embodiment, there is a possibility that the plasma PLM drags impurity ions generated at the sheet TE into the plasma PLM and the impurities adhere to the bonding surfaces CPf of the chips CP. In contrast, since the present configuration is a configuration in which a particle beam is radiated on the bonding surfaces CPf of the chips CP, impurities generated from the chips CP or the sheet TE are blown away in directions separating away from the chips CP and do not return to the side on which the bonding surfaces CPf of the chips CP are located. Therefore, it is possible to prevent impurities from adhering to the bonding surfaces CPf of the chips CP.

In the embodiment, the activation treatment device 60 may be an activation treatment device including an ion beam source to accelerate and emit ions of nitrogen.

Figure 18A:
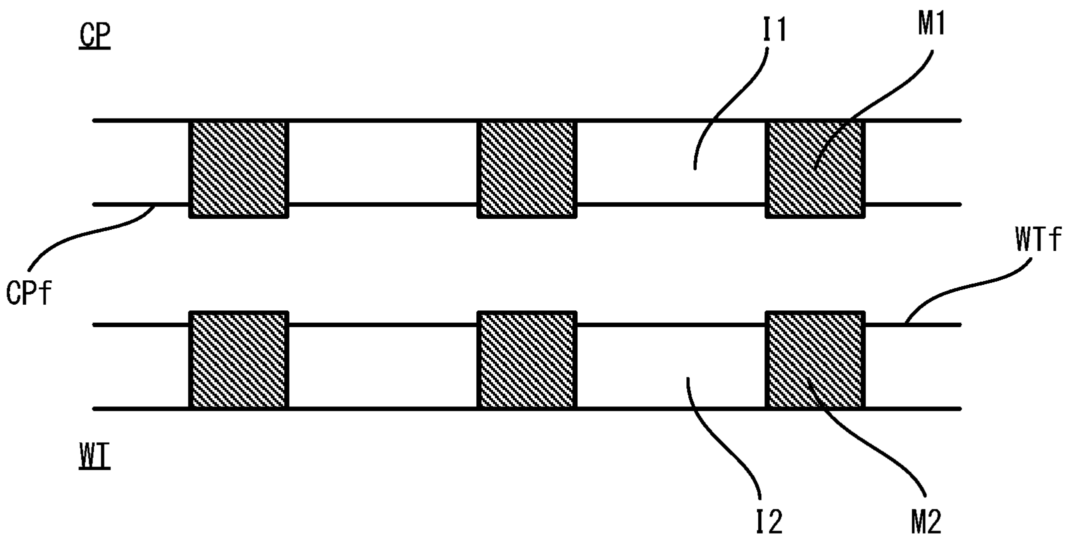
FIG. 18A illustrates a chip and a substrate according to still another variation and is a cross-sectional view of a state before the chip is bonded to the substrate.

In the embodiment, on the mounting surface WTf of the substrate WT, first conductive portions M2 that are formed of a conductive material and first insulator portions I2 that are formed of an insulator may be exposed while being substantially flush with each other, as illustrated in, for example, FIG. 18A. Note that the first conductive portions M2 may protrude beyond the first insulator portions I2. In addition, on the bonding surface CPf of a chip CP, second conductive portions M1 that are formed of a conductive material and second insulator portions I1 that are formed of an insulator may be exposed while being substantially flush with each other. Note that the second conductive portions M1 may protrude beyond the second insulator portions I1. In this configuration, examples of the insulator include an oxide, such as $SiO_2$ and $Al_2O_3$, a nitride, such as SiN and AlN, an oxynitride, such as SiON, and a resin. In addition, examples of the conductive material include a semiconductor material, such as Si and Ge, and a metal, such as Cu, Al, and solder. In other words, the chip may be a chip on the bonding surface of which a plurality of types of regions made of materials different from one another are formed. Specifically, the chip may be a chip on the bonding surface of which electrodes and insulating films are formed and the insulating films of which are formed of an oxide, such as $SiO_2$ and $Al_2O_3$, or a nitride, such as SiN and AlN.

Figure 18B:
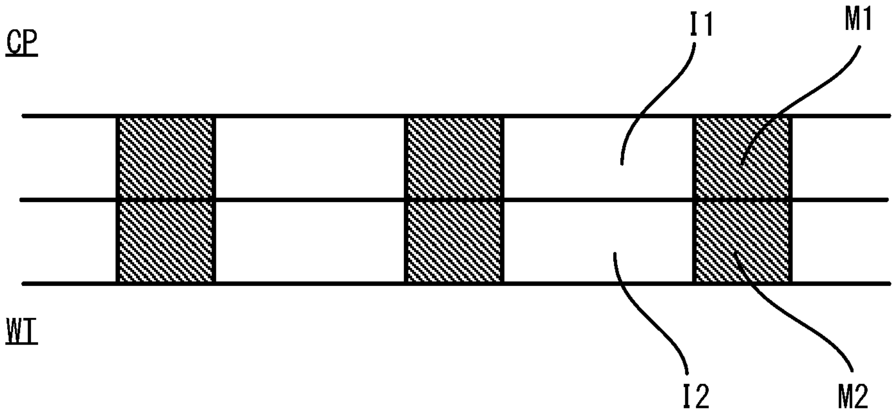
FIG. 18B illustrates the chip and the substrate according to the still another variation and is a cross-sectional view of a state in which the chip is bonded to the substrate.

When the bonding surface CPf of the chip CP and the mounting surface WTf of the substrate WT are brought into surface contact with each other in such a manner that the first conductive portions M2 and the second conductive portions M1 come into contact with each other and the first insulator portions I2 and the second insulator portions I1 come into contact with each other, the chip CP is bonded to the substrate WT, as illustrated in FIG. 18B.

In the embodiment, the cleaning device 85 may be, for example, a cleaning device including a cleaning head to discharge a fluid to which ultrasonic waves or megasonic vibration is applied to a plurality of chips CP stuck on a sheet TE held by the ring-shaped frames RI2 and RI3 supported by the stage 852. In addition, the fluid discharged from the cleaning head is not limited to water and may be another type of fluid, such as cleaning fluid reducing an electrode surface and an organic solvent. Further, the cleaning device may be a cleaning device including a brush (not illustrated) to scrape off particles having adhered to the bonding surfaces of chips CP. Note that, when the cleaning device is a cleaning device including a brush, hardness of the brush is preferably set to softness that does not influence the activated state of the bonding surfaces CPf of the chips CP. In addition, the cleaning device may be a cleaning device that, by blowing, for example, an inert gas, such as $N_2$, in place of fluid, on the chip CP, removes particles having adhered to the chip CP.

Figure 19:
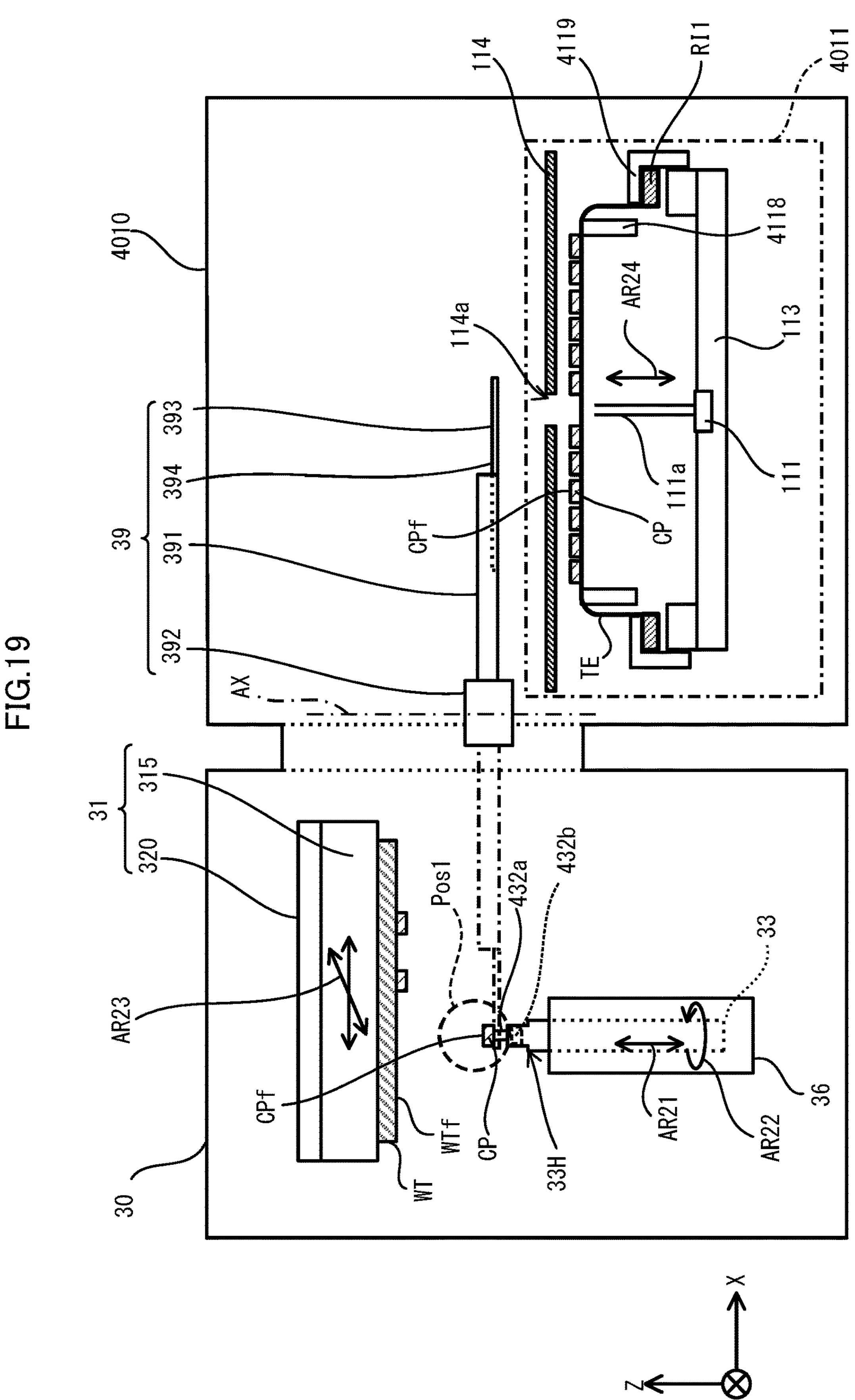
FIG. 19 is a schematic configuration diagram of a chip feeding device, a chip transportation device, and a bonding device according to still another variation when viewed from a lateral side.

An example in which the chip feeding device 10 according to the embodiment includes the chip feeder 11 including the frame support 119 to support the ring-shaped frames RI2 and RI3 holding a sheet TE without stretching the sheet TE was described. Note, however, that the configuration of the chip feeding device is not limited to the configuration that feeds a chip CP with a sheet TE held by the ring-shaped frames RI2 and RI3 without being stretched. For example, the chip bonding system may be a chip bonding system including a chip feeding device 4010 that includes a chip feeder 4011 to feed a chip CP with a sheet TE held by the ring-shaped frame RI1, as illustrated in FIG. 19. In this configuration, the chip feeder 4011 includes a cylindrical drum 4118 to stretch the sheet TE and a frame holder 4119 to hold the ring-shaped frame RI1. The chip feeder 4011 brings, with the ring-shaped frame RI1 held by the frame holder 4119, the edge on the +Z-direction side of the drum 4118 into contact with the −Z-direction side of the sheet TE inside the ring-shaped frame RI1. The chip feeder 4011, by pushing out the edge on the +Z-direction side of the drum 4118 to the +Z-direction side of the frame holder 4119, stretches the sheet TE. Note that the chip feeder 4011 is only required to be configured to relatively move the drum 4118 to the +Z-direction side of the frame holder 4119 and may be a chip feeder that, for example, moves the frame holder 4119 to the −Z-direction side of the drum 4118.

In addition, the chip feeder 4011 may be a chip feeder that feeds a chip CP with the sheet TE held by the ring-shaped frames RI2 and RI3. Even when the sheet TE is in a state of being held by the ring-shaped frames RI2 and RI3, looseness sometimes occurs to the sheet TE as chips CP are successively cut out from the sheet TE. In contrast, according to the present configuration, it is possible to eliminate looseness of the sheet by pushing out the drum 4118 in the +Z-direction at a point in time when a certain number of chips CP have been cut out from the sheet TE held by the ring-shaped frames RI2 and RI3.

Since the present configuration causes the sheet stretching device 40 to be unnecessary in the case where the cleaning step is not performed after the activation treatment by the activation treatment device 60, it is possible to accordingly simplify the bonding system 1.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2020-129988, filed on Jul. 31, 2020, the entire disclosure of which is incorporated by reference herein.

INDUSTRIAL APPLICABILITY

The present disclosure is suitable for manufacturing of, for example, CMOS image sensors, memories, arithmetic elements, or MEMS.

REFERENCE SIGNS LIST

1 Chip bonding system
10, 4010 Chip feeding device
11, 4011 Chip feeder
20 Dicing device
30 Bonding device
31 Stage unit
33 Bonder
33H, 3033H Head
36, 3036 Head driver
39 Chip transportation device
40 Sheet stretching device
60 Activation treatment device
3061 Particle beam source
3063 Beam source transporter
64 Chamber
3064*a* Hole
70 Transportation device
71 Transportation robot
80 Carrying in/out unit
85 Cleaning device
90 Controller
111 Pickup mechanism
111*a* Needle
113 Frame driver
114, 622 Cover
114*a* Hole
119, 411 Frame support
211 Rotary shaft
212 Blade driver
213 Cutting blade
215 Holding table
216 Chuck
315 Stage
320, 853 Stage driver
391 Plate
392 Plate driver
393 Chip holder
394 Arm
395 Arm driver
411*a*, 411*b* Through-hole
413 Cutting mechanism
432*a* Chip support
432*b* Support driver
621, 4119 Frame holder
2121 Support
2122 Motor
2123 Support moving mechanism
3611 Electrode
3612 Discharge chamber
3612*a* FAB radiation port
3613 Beam source driver
3614, 3677 Gas feeder
3623 Frame holder driver
3631 Support rod
3632 Support base
3633 Support base driver
3634 Bellows
3672 Magnetron
3673 Waveguide
3674 Glass window
3671 Plasma chamber
3676 Feeding pipe
851 Cleaning head
852 Stage
33411 Chip tool
33413 Head body
CP Chip
CPf Bonding surface
TE Sheet
OB1 Orbit
PLM, PLM2 Plasma
WD Dicing substrate
WT Substrate
WTf Mounting surface

The invention claimed is:

1. A chip bonding system for bonding a chip to a substrate, comprising:

a dicing device to, by dicing a dicing substrate stuck on a sheet, generate a plurality of chips that is stuck on the sheet with chips adjacent to each other in contact with each other or joined to each other at portions in a direction orthogonal to a thickness direction of the dicing substrate;

an activation treatment device to activate bonding surfaces of respective ones of the plurality of chips that is stuck on the sheet with chips adjacent to each other in contact with each other or joined to each other at portions, to bond each of the plurality of chips to the substrate; and a chip bonding device to, after the bonding surfaces are activated by the activation treatment device, by bringing one chip picked out of the plurality of chips, the plurality of chips being stuck on the sheet while being separated from one another, into contact with the substrate, bond the one chip to the substrate, wherein the activation treatment device includes:

a sheet support to support the sheet on which the plurality of chips is stuck while being in contact with each other or joined to each other at portions; and a cover to, with the sheet supported by the sheet support, cover the sheet excluding a portion of the sheet on which the plurality of chips is stuck from a side of the sheet on which the plurality of chips is stuck.

2. A chip bonding system for bonding a chip to a substrate, comprising:

a dicing device to, by dicing a dicing substrate stuck on a sheet, generate a plurality of chips that is stuck on the sheet with chips adjacent to each other in contact with each other or joined to each other at portions in a direction orthogonal to a thickness direction of the dicing substrate;

an activation treatment device to activate bonding surfaces of respective ones of the plurality of chips that is stuck on the sheet with chips adjacent to each other in contact with each other or joined to each other at portions, to bond each of the plurality of chips to the substrate; and a chip bonding device to, after the bonding surfaces are activated by the activation treatment device, by bringing one chip picked out of the plurality of chips, the plurality of chips being stuck on the sheet while being separated from one another, into contact with the substrate, bond the one chip to the substrate, wherein the chip bonding device includes:

a substrate holder to hold the substrate in such an attitude that a mounting surface of the substrate faces vertically downward;

a head to support one chip among the plurality of chips in such an attitude that a bonding surface of the one chip faces vertically upward; and a relative position changer to, by bringing the head relatively close to the substrate holder, bond the one chip to the substrate.

3. The bonding system according to claim 2, wherein the relative position changer, by bringing the head relatively close to the substrate holder, bond the one chip to the substrate through hydrophilic bonding.

4. The bonding system according to claim 2, wherein the relative position changer, by bringing the head relatively close to the substrate holder, brings the flat bonding surface of the one chip into surface contact with the flat mounting surface of the substrate.

5. The chip bonding system according to claim 2 further comprising a chip transportation device to, while holding an opposite side to the bonding surface side of the one chip, transport the one chip to a handover position at which the chip transportation device hands over the one chip to the chip bonding device.

6. The chip bonding system according to claim 2 further comprising a sheet stretching device to, after the bonding surfaces are activated by the activation treatment device, by stretching the sheet on which the plurality of chips, the plurality of chips being in a state in which chips adjacent to each other are in contact with each other or joined to each other at portions, is stuck, bring the plurality of chips into a state of being separated from each other.

7. The chip bonding system according to claim 2, wherein the dicing device includes:

a cutting blade to cut the dicing substrate; and a blade driver to, by moving the cutting blade along planned division lines located at circumferences of portions corresponding to the plurality of chips and forming cut trenches, generate a plurality of chips that is stuck on the sheet with chips adjacent to each other joined to each other via remaining uncut portions in a direction orthogonal to a thickness direction of the dicing substrate.

8. The chip bonding system according to claim 2, wherein the dicing device includes:

a laser processing head to emit laser light with a wavelength that is transmitted through the dicing substrate; and a laser processing head driver to, by moving the laser processing head along planned division lines located at circumferences of portions corresponding to the plurality of chips while maintaining distance between the laser processing head and the dicing substrate in such a manner that a converging point of the laser light is located inside the dicing substrate, generate a plurality of chips that is stuck on the sheet with chips adjacent to each other joined to each other via property altered spots, the property altered spots being formed inside the dicing substrate, in a direction orthogonal to a thickness direction of the dicing substrate.

9. The chip bonding system according to claim 2, wherein the activation treatment device includes:

a sheet support to support the sheet on which the plurality of chips is stuck while being in contact with each other or joined to each other at portions; and a plasma generator to, by generating plasma on a side of the sheet, the sheet being supported by the sheet support, on which the plurality of chips is stuck, activate bonding surfaces of respective ones of the plurality of chips.

10. The chip bonding system according to claim 2, wherein the activation treatment device includes:

a sheet support to support the sheet on which the plurality of chips is stuck while being in contact with each other or joined to each other at portions; and a particle beam source to, by irradiating a side of the sheet, the sheet being supported by the sheet support, on which the plurality of chips is stuck with a particle beam, activate bonding surfaces of respective ones of the plurality of chips.

11. The chip bonding system according to claim 6, wherein the sheet stretching device includes:

a frame holder to hold a first ring-shaped frame holding the sheet;

a first frame support to support a second ring-shaped frame that has an outside dimension smaller than an inside dimension of the first ring-shaped frame; and a frame position changer to stretch the sheet in a radial manner from a central portion of the first ring-shaped frame and bring the plurality of chips into a state of being separated from one another by relatively moving at least one of the first ring-shaped frame and the second ring-shaped frame with respect to the other while making the second ring-shaped frame in contact with an opposite side to a side of the sheet on which the plurality of chips is stuck, and subsequently, by a third ring-shaped frame being fitted onto an outer periphery of the second ring-shaped frame in such a manner as to sandwich the sheet, maintain the sheet in a state of being held by the second ring-shaped frame and the third ring-shaped frame.

12. The chip bonding system according to claim 2 further comprising a cleaning device to, before the chip is bonded to the substrate by the chip bonding device, clean bonding surfaces of the plurality of chips that is stuck on the sheet while being separated from one another.

13. The chip bonding system according to claim 11 further comprising a cleaning device including:

a sheet holder to suck and hold the sheet on which the plurality of chips is stuck while being separated from one another and that is held by the second ring-shaped frame and the third ring-shaped frame; and a cleaning head to, by spraying water on a side of the sheet on which the plurality of chips is stuck with the sheet sucked and held by the sheet holder, clean bonding surfaces of the plurality of chips.

14. The chip bonding system according to claim 13 further comprising a chip feeding device including:

a second frame support to support at least one of the second ring-shaped frame and the third ring-shaped frame that hold the sheet on which the plurality of chips is stuck while being separated from one another; and a pickup mechanism to pick one chip out of the plurality of chips that is stuck on the sheet.

15. The chip bonding system according to claim 14, wherein the dicing device and the activation treatment device perform processing with the sheet held by the first ring-shaped frame, and the cleaning device and the chip feeding device perform processing with the sheet held by the second ring-shaped frame and the third ring-shaped frame.

16. A chip bonding method for bonding a chip to a substrate, the method comprising:

a dicing step of, by dicing a dicing substrate stuck on a sheet, generating a plurality of chips that is arranged with chips adjacent to each other in contact with each other in a direction orthogonal to a thickness direction of the dicing substrate;

an activation step of activating bonding surfaces of respective ones of the plurality of chips that is stuck on the sheet while being in contact with each other or joined to each other at portions, to bond each of the plurality of chips to the substrate;

a stretching step of, by stretching the sheet on which the plurality of chips, the plurality of chips having the bonding surfaces activated in the activation step, is stuck, bringing the plurality of chips into a state of being separated from one another; and a bonding step of, by bringing one chip picked out of the plurality of chips into contact with the substrate, bonding the one chip to the substrate.

17. The chip bonding method according to claim 16, wherein, in the dicing step, the chip bonding method, by moving a cutting blade to cut the dicing substrate along planned division lines located at circumferences of portions corresponding to the plurality of chips and forming cut trenches, generates a plurality of chips that is stuck on the sheet with chips adjacent to each other joined to each other via remaining uncut portions in a direction orthogonal to a thickness direction of the dicing substrate.

18. The chip bonding method according to claim 16, wherein, in the dicing step, the chip bonding method, by moving a laser processing head to emit laser light with a wavelength that is transmitted through the dicing substrate along planned division lines located at circumferences of portions corresponding to the plurality of chips while maintaining distance between the laser processing head and the dicing substrate in such a manner that a converging point of the laser light is located inside the dicing substrate, generates a plurality of chips that is stuck on the sheet with chips adjacent to each other joined to each other via property altered spots, the property altered spots being formed inside the dicing substrate, in a direction orthogonal to a thickness direction of the dicing substrate.

19. The chip bonding method according to claim 16, wherein, in the activation step, the chip bonding method, while covering by a cover the sheet on which the plurality of chips, the plurality of chips being in contact with each other or joined to each other at portions, is stuck excluding a portion of the sheet on which the plurality of chips is stuck, activates bonding surfaces of respective ones of the plurality of chips stuck on the sheet.

20. The chip bonding method according to claim 16, wherein, in the activation step, the chip bonding method, by generating plasma on a side on which the plurality of chips, the plurality of chips being in contact with each other or joined to each other at portions, is stuck of the sheet on which the plurality of chips is stuck, activates bonding surfaces of respective ones of the plurality of chips.

21. The chip bonding method according to claim 16, wherein, in the activation step, the chip bonding method, by irradiating a side on which the plurality of chips, the plurality of chips being in contact with each other or joined to each other at portions, is stuck of the sheet on which the plurality of chips is stuck with a particle beam, activates bonding surfaces of respective ones of the plurality of chips.

22. The chip bonding method according to claim 16, wherein, in the stretching step, the chip bonding method, by, while holding a first ring-shaped frame holding the sheet, moving a second ring-shaped frame, the second ring-shaped frame having an outside dimension smaller than an inside dimension of the first ring-shaped frame, to a side of the sheet on which the plurality of chips is stuck beyond the first ring-shaped frame while making the second ring-shaped frame in contact with an opposite side to a side of the sheet on which the plurality of chips is stuck, stretches the sheet in a radial manner from a central portion of the first ring-shaped frame and, with the plurality of chips separated from one another, fits a third ring-shaped frame onto an outer periphery of the second ring-shaped frame in such a manner as to sandwich the sheet.

23. The chip bonding method according to claim 16 further comprising a cleaning step of cleaning bonding surfaces of the plurality of chips that is stuck on the sheet while being separated from one another.

24. The chip bonding method according to claim 22 further comprising a cleaning step of, while the sheet on which the plurality of chips is stuck while being separated from one another is held by the second ring-shaped frame and the third ring-shaped frame, cleaning bonding surfaces of the plurality of chips by spraying water on a side of the sheet on which the plurality of chips is stuck.

25. The chip bonding method according to claim 22, wherein, in the bonding step, while the sheet on which the plurality of chips is stuck while being separated from one another is held by the second ring-shaped frame and the third ring-shaped frame, the chip bonding method picks one chip out of the plurality of chips that is stuck on the sheet.

26. The chip bonding method according to claim 25, wherein the dicing step and the activation step are performed with the sheet held by the first ring-shaped frame, and the bonding step is performed with the sheet held by the second ring-shaped frame and the third ring-shaped frame.

27. The chip bonding method according to claim 16, wherein, in the bonding step, the chip bonding method, by holding the substrate in such an attitude that a mounting surface of the substrate faces vertically downward and bringing one chip among the plurality of chips relatively close to the substrate in such an attitude that a bonding surface of the one chip faces vertically upward, bonds the one chip to the substrate.

28. The chip bonding method according to claim 27, wherein, in the bonding step, the chip bonding method bonds the one chip to the substrate through hydrophilic bonding.

29. The chip bonding method according to claim 27, wherein, in the bonding step, the chip bonding method brings the flat bonding surface of the one chip into surface contact with the flat mounting surface of the substrate.

30. The chip bonding method according to claim 29, wherein on the mounting surface of the substrate, a first conductive portion formed of a metal and a first insulator portion formed of an insulator are exposed while being flush with each other, on the bonding surface of the one chip, a second conductive portion formed of a metal and a second insulator portion formed of an insulator are exposed while being flush with each other, and in the bonding step, the chip mounting method brings the bonding surface of the one chip into surface contact with the mounting surface of the substrate in such a manner that the first conductive portion and the second conductive portion come into contact with each other and the first insulator portion and the second insulator portion come into contact with each other.

31. The chip bonding method according to claim 16, wherein, in the bonding step, the chip bonding method, while holding an opposite side to the bonding surface side of the one chip, transports the one chip to a handover position to a head to support the one chip.

32. The chip bonding method according to claim 16 further comprising:

a substrate mounting surface activation step of activating a mounting surface of the substrate; and a substrate mounting surface cleaning step of, after the substrate mounting surface activation step, cleaning the mounting surface, wherein, in the bonding step, the chip bonding method, by bringing the one chip into contact with the mounting surface after having been cleaned in the substrate mounting surface cleaning step, bonds the one chip to the substrate.

* * * * *